(12) United States Patent
Moon et al.

(10) Patent No.: US 11,456,419 B2
(45) Date of Patent: Sep. 27, 2022

(54) VARIABLE RESISTANCE MEMORY DEVICE

(71) Applicant: Samsung Electronics Co., Ltd., Suwon-si (KR)

(72) Inventors: Juhyun Moon, Incheon (KR); Youngju Kwak, Seongnam-si (KR); Seunghan Yoo, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 78 days.

(21) Appl. No.: 17/144,502

(22) Filed: Jan. 8, 2021

(65) Prior Publication Data
US 2021/0399220 A1 Dec. 23, 2021

(30) Foreign Application Priority Data

Jun. 22, 2020 (KR) .................. 10-2020-0075755

(51) Int. Cl.
*H01L 45/00* (2006.01)
*H01L 27/24* (2006.01)
*H01L 21/768* (2006.01)

(52) U.S. Cl.
CPC .... *H01L 45/1675* (2013.01); *H01L 21/76831* (2013.01); *H01L 21/76832* (2013.01); *H01L 21/76877* (2013.01); *H01L 27/2463* (2013.01); *H01L 45/1253* (2013.01); *H01L 45/146* (2013.01); *H01L 45/1616* (2013.01)

(58) Field of Classification Search
CPC .................................... H01L 45/1616
See application file for complete search history.

(56) References Cited

U.S. PATENT DOCUMENTS

| | | | |
|---|---|---|---|
| 7,915,137 B2 | 3/2011 | Williams | |
| 9,391,269 B2 | 7/2016 | Lee et al. | |
| 9,704,923 B1 | 7/2017 | Bernhardt et al. | |
| 9,748,311 B2 | 8/2017 | Fantini et al. | |
| 9,768,378 B2 | 9/2017 | Pellizzer et al. | |
| 9,887,354 B2 | 2/2018 | Jeong et al. | |
| 2018/0012894 A1* | 1/2018 | Kim | H01L 21/31111 |
| 2019/0097007 A1* | 3/2019 | Ahn | H01L 21/76897 |
| 2020/0194302 A1* | 6/2020 | Ahn | H01L 21/7687 |
| 2021/0313398 A1* | 10/2021 | Kim | H01L 27/2427 |
| 2021/0384427 A1* | 12/2021 | Park | H01L 45/1683 |

* cited by examiner

Primary Examiner — Mounir S Amer
(74) Attorney, Agent, or Firm — Muir Patent Law, PLLC

(57) ABSTRACT

A variable resistance memory device includes first conductive lines, second conductive lines arranged on the first conductive lines, first cell structures at intersections between the first conductive lines and the second conductive lines, each first cell structure including a switching pattern and a variable resistance pattern, first buried structures filling first trenches between the first conductive lines, and second buried structures filling second trenches between the first cell structures. Each first buried structure includes a first liner pattern covering sidewalls of a corresponding first trench, a first filling pattern being disposed on the first liner pattern and in the corresponding first trench, and a first capping pattern sealing the corresponding first trench. The second buried structures extend in the plurality of second trenches and are connected with first capping patterns of the first buried structures.

20 Claims, 27 Drawing Sheets

VARIABLE RESISTANCE MEMORY DEVICE

CROSS-REFERENCE TO RELATED APPLICATION

This U.S. nonprovisional application claims priority under 35 U.S.C § 119 to Korean Patent Application No. 10-2020-0075755 filed on Jun. 22, 2020 in the Korean Intellectual Property Office, the disclosure of which is hereby incorporated by reference in its entirety.

BACKGROUND

The present inventive concepts relate to a semiconductor memory device, and more particularly, to a variable resistance memory device.

Semiconductor devices may be classified into memory devices and logic devices. Memory devices store data. In general, semiconductor memory devices may be broadly classified into volatile memory devices and nonvolatile memory devices. The volatile memory devices, such as dynamic random access memory (DRAM) and static random access memory (SRAM), lose stored data when their power supply is interrupted. The nonvolatile memory devices, such as programmable ROM (PROM), erasable PROM (EPROM), electrically erasable (EEPROM), and Flash memory device, do not lose stored data even when their power supply is inhibited.

SUMMARY

Some example embodiments of the present inventive concepts provide a variable resistance memory device capable of avoiding leaning or bridging that may occur during patterning.

According to an exemplary embodiment of the present invention, a variable resistance memory device includes a plurality of first conductive lines extending in a first direction, a plurality of second conductive lines extending in a second direction crossing the first direction and being arranged on the plurality of first conductive lines, a plurality of first cell structures at intersections between the plurality of first conductive lines and the plurality of second conductive lines, each of the first cell structures including a switching pattern and a variable resistance pattern, a plurality of first buried structures filling a plurality of first trenches between the plurality of first conductive lines and extending in the first direction, and a plurality of second buried structures filling a plurality of second trenches between the plurality of first cell structures. Each of the plurality of first buried structures includes a first liner pattern covering sidewalls of a corresponding first trench of the plurality of first trenches, a first filling pattern being disposed on the first liner pattern and in the corresponding first trench, and a first capping pattern sealing the corresponding first trench in which the first liner pattern and the first filling pattern are provided. The plurality of second buried structures extend in the plurality of second trenches and are connected with a plurality of first capping patterns of the plurality of first buried structures.

According to an exemplary embodiment of the present invention, a variable resistance memory device includes a plurality of first conductive lines that extend in a first direction, a plurality of second conductive lines that extend in a second direction crossing the first direction and are arranged on the plurality of first conductive lines, a plurality of first cell structures at intersections between the plurality of first conductive lines and the plurality of second conductive lines, each of the plurality of first cell structures including a switching pattern and a variable resistance pattern, and a plurality of first buried structures that fill a plurality of first trenches between the plurality of first conductive lines and extend in the first direction. Each of the plurality of first buried structures includes a first liner pattern that covers sidewalls of a corresponding first trench of the plurality of first trenches, a first filling pattern on the first liner pattern and in the corresponding first trench, and a capping pattern disposed in the corresponding first trench. The capping pattern covers a top surface of the first liner pattern and a top surface of the first filling pattern. A bottom surface of the capping pattern has a convex shape toward the capping pattern. The lowermost bottom surface of the capping pattern is positioned at a level that is equal to or greater than about $2/3$ times a height of a first conductive line of the plurality of first conductive lines. The first conductive line is adjacent to the corresponding first trench.

According to an exemplary embodiment of the present invention, a variable resistance memory device includes a substrate, a plurality of first conductive lines on the substrate, the plurality of first conductive lines extending in a first direction, a plurality of second conductive lines that extend in a second direction crossing the first direction and are arranged on the plurality of first conductive lines, a plurality of first cell structures at intersections between the plurality of first conductive lines and the plurality of second conductive lines, a plurality of first buried structures that fill a plurality of first trenches between the plurality of first conductive lines and extend in the first direction, and a plurality of second buried structures that fill a plurality of second trenches between the plurality of first cell structures. Each of the plurality of first buried structures includes a first liner pattern that covers sidewalls of a corresponding first trench among the plurality of first trenches, a first filling pattern on the first liner pattern and in the corresponding first trench, and a first capping pattern on the first filling pattern and in the corresponding first trench. Each of the plurality of second buried structures includes a second liner pattern and a second filling pattern. Each of the first plurality of cell structures includes a first electrode, a switching pattern, a second electrode, a variable resistance pattern, and a third electrode that are sequentially provided. The plurality of second buried structures extend in the plurality of second trenches and are connected with a plurality of first capping patterns of the plurality of first buried structures.

According to an exemplary embodiment of the present invention, a method of fabricating a variable resistance memory device includes forming on a substrate a plurality of first conductive lines that extend in a first direction, forming a plurality of first buried structures between the plurality of first conductive lines, forming a plurality of first cell structures on the plurality of first conductive lines, and forming a plurality of second buried structures between the plurality of first cell structures. The forming of the plurality of first buried structures includes forming a first liner layer and a first filling layer that fill a plurality of trenches between the plurality of first conductive lines, performing a planarization process to expose top surfaces of the plurality of first conductive lines and to recess an upper portion of the first filling layer and an upper portion of the first liner layer, the recessed first filling layer and the recessed first liner layer being separated into a plurality of first filling patterns and a plurality of first liner patterns, respectively, and top surfaces of the plurality of first filling patterns and top surfaces of the plurality of first liner patterns are positioned below the exposed top surfaces of the plurality of first conductive lines to form a plurality of first recessed regions between the plurality of first conductive lines, and forming a plurality of preliminary capping patterns that fill the plurality of first recessed regions.

DETAILED DESCRIPTION OF EMBODIMENTS

Figure 1:
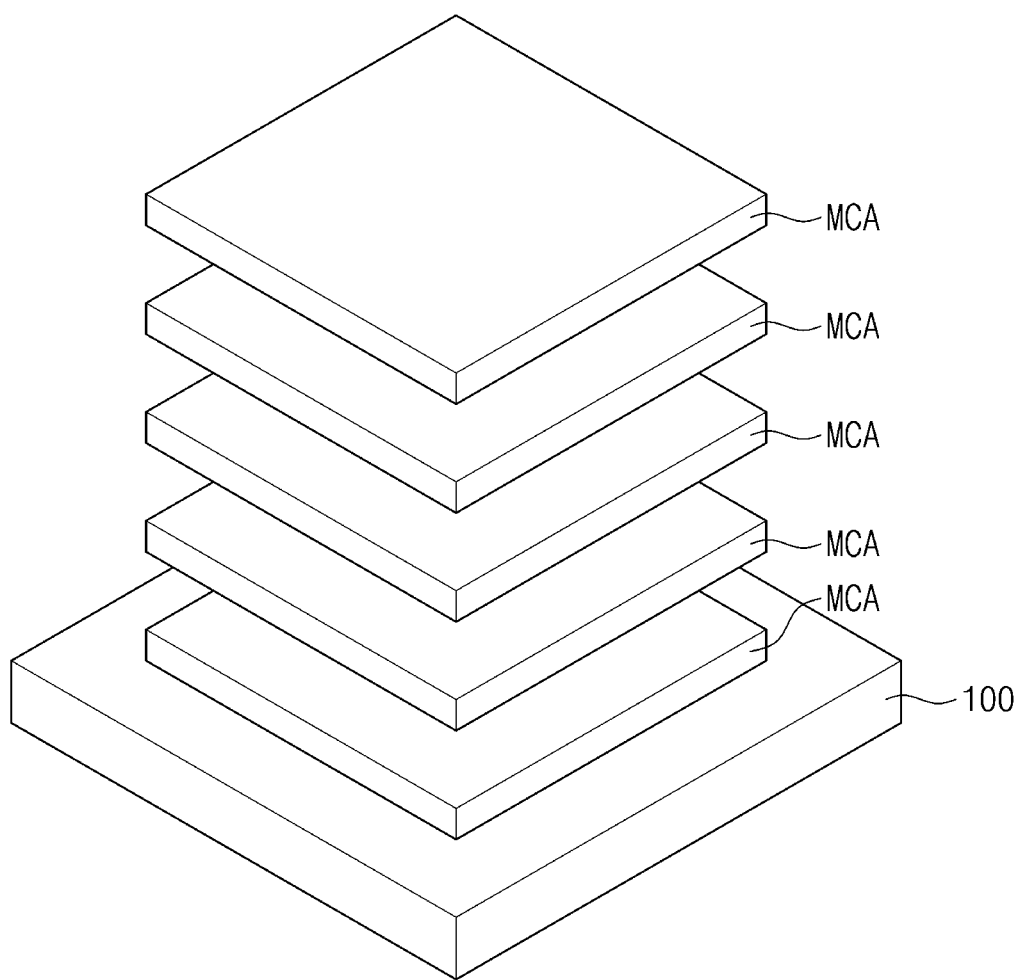
FIG. 1 illustrates a conceptual view showing a variable resistance memory device according to some example embodiments of the present inventive concepts.

FIG. 1 illustrates a conceptual view showing a variable resistance memory device according to some example embodiments of the present inventive concepts. Referring to FIG. 1, a variable resistance memory device according to some example embodiments of the present inventive concepts may include a plurality of memory cell stacks MCA sequentially stacked on a substrate 100. Each of the memory cell stacks MCA may include a plurality of variable resistance memory cells that are two-dimensionally arranged. The variable resistance memory device according to some example embodiments of the present inventive concepts may include a plurality of conductive lines that are disposed to lie between the memory cell stacks MCA and to write, read, and erase the memory cells. FIG. 1 shows five memory cell stacks MCA, but some example embodiments of the present inventive concepts are not limited thereto.

Figure 2:
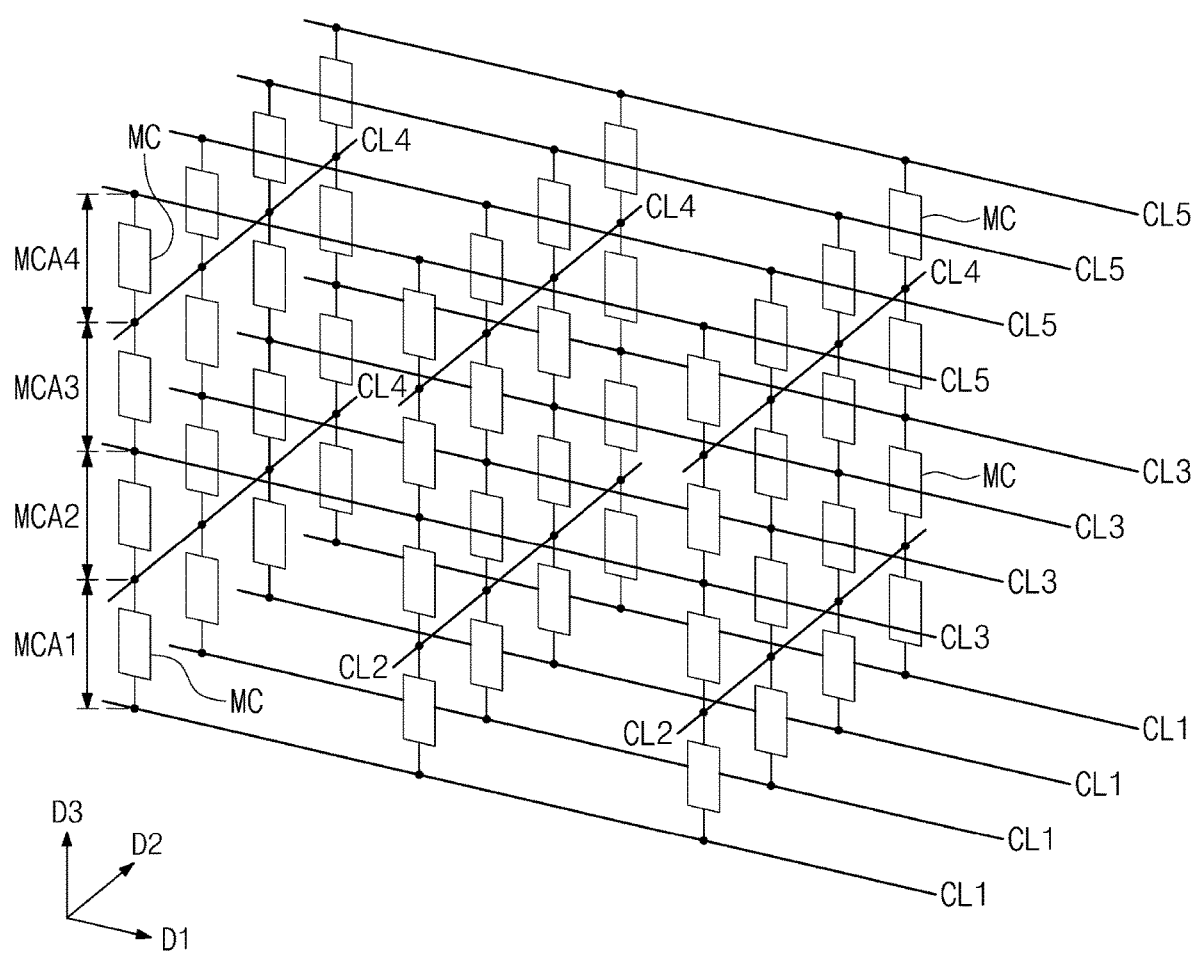
FIG. 2 illustrates a circuit diagram showing memory cell stacks of FIG. 1.
Figure 12:
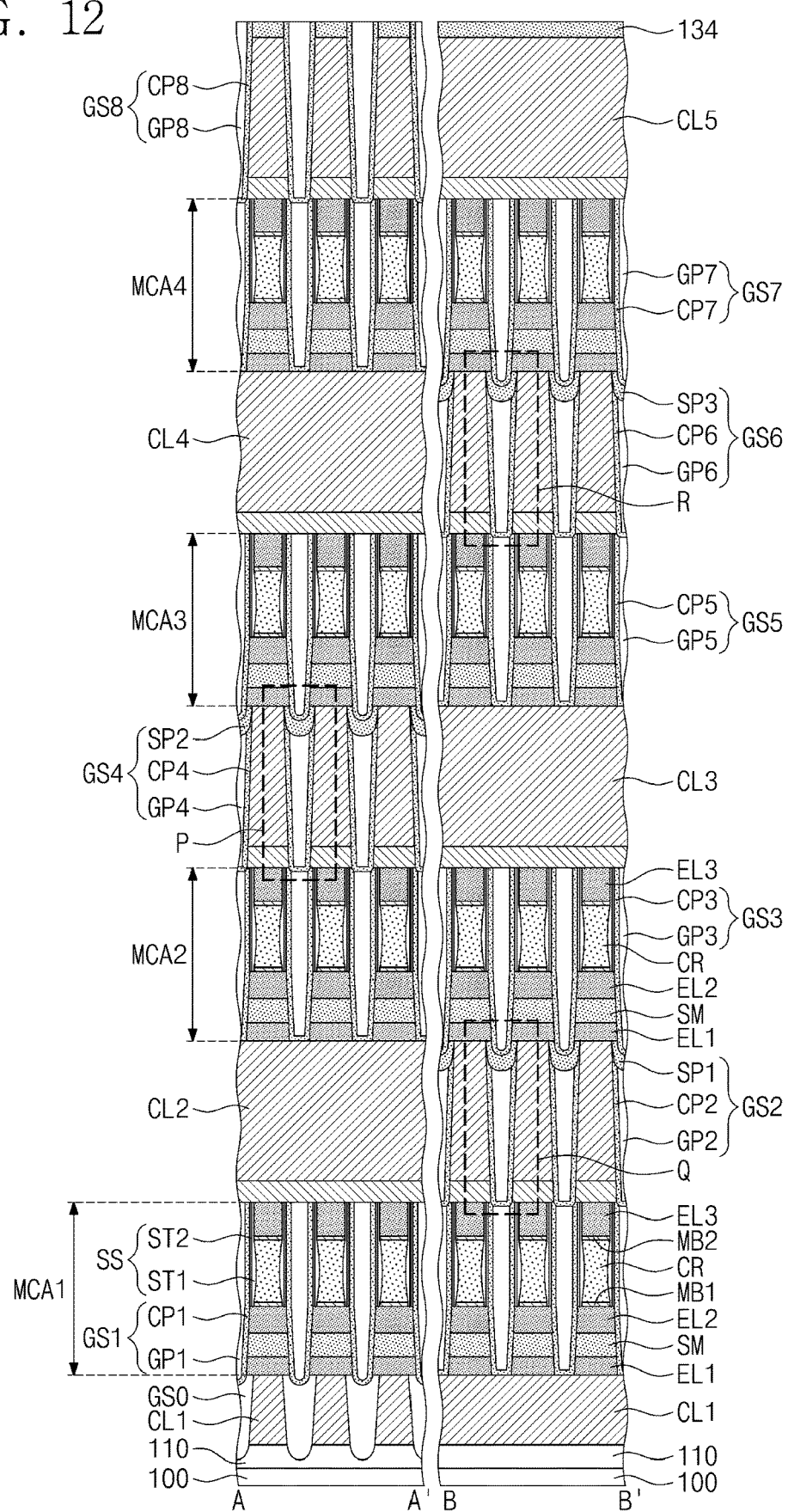
FIG. 12 illustrates a cross-sectional view taken along lines A-A' and B-B' of FIG. 3, showing a variable resistance memory device according to some example embodiments of the present inventive concepts.

FIG. 2 illustrates a circuit diagram showing the memory cell stacks of FIG. 1. FIG. 2 shows first to fourth memory cell stacks MCA1 to MCA4, or alternatively, more than or less than four memory cell stacks may be provided. For example, the variable resistance memory device according to some example embodiments of the present inventive concepts may include two memory cell stacks (e.g., the first memory cell stack MCA1 and the second memory cell stack MCA2). The first memory cell stack MCA1 may include cell structures MC provided at intersections between first conductive lines CL1 and second conductive lines CL2. Similar to the first memory cell stack MCA1, the second memory cell stack MCA2 may include cell structures MC provided at intersections between the second conductive lines CL2 and third conductive lines CL3. The first and second memory cell stacks MCA1 and MCA2 may share the second conductive lines CL2. Alternatively, the second memory cell stack MCA2 does not share any conductive line with the first memory cell stack MCA1. With reference to FIG. 12, an embodiment will be discussed regarding the third and fourth memory cell stacks MCA3 and MCA4.

The cell structures MC of the first memory cell stack MCA1 may be two-dimensionally arranged in rows and columns on a substrate. Each of the cell structures MC may include a switching pattern and a variable resistance pattern. When the first conductive lines CL1 are provided between the substrate and the second conductive lines CL2, each cell structure MC may be configured such that the switching pattern is provided between the substrate and the variable resistance pattern. Alternatively, the variable resistance pattern may be provided between the substrate and the switching pattern.

The switching pattern may be disposed at each of intersections between the first conductive lines CL1 and the second conductive lines CL2, and may be physically separated from other switching patterns disposed at adjacent intersections. The variable resistance pattern may be disposed at a corresponding one of the intersections between the first conductive lines CL1 and the second conductive lines CL2, and may be physically separated from other variable resistance patterns disposed at adjacent intersections. Alternatively, a physically connected variable resistance pattern may be shared between a plurality of cell structures MC. For example, when viewed in plan, the variable resistance pattern may have a linear shape (e.g., a straight-line shape) that extends along an extending direction either of the first conductive lines CL1 or of the second conductive lines CL2.

Figure 3:
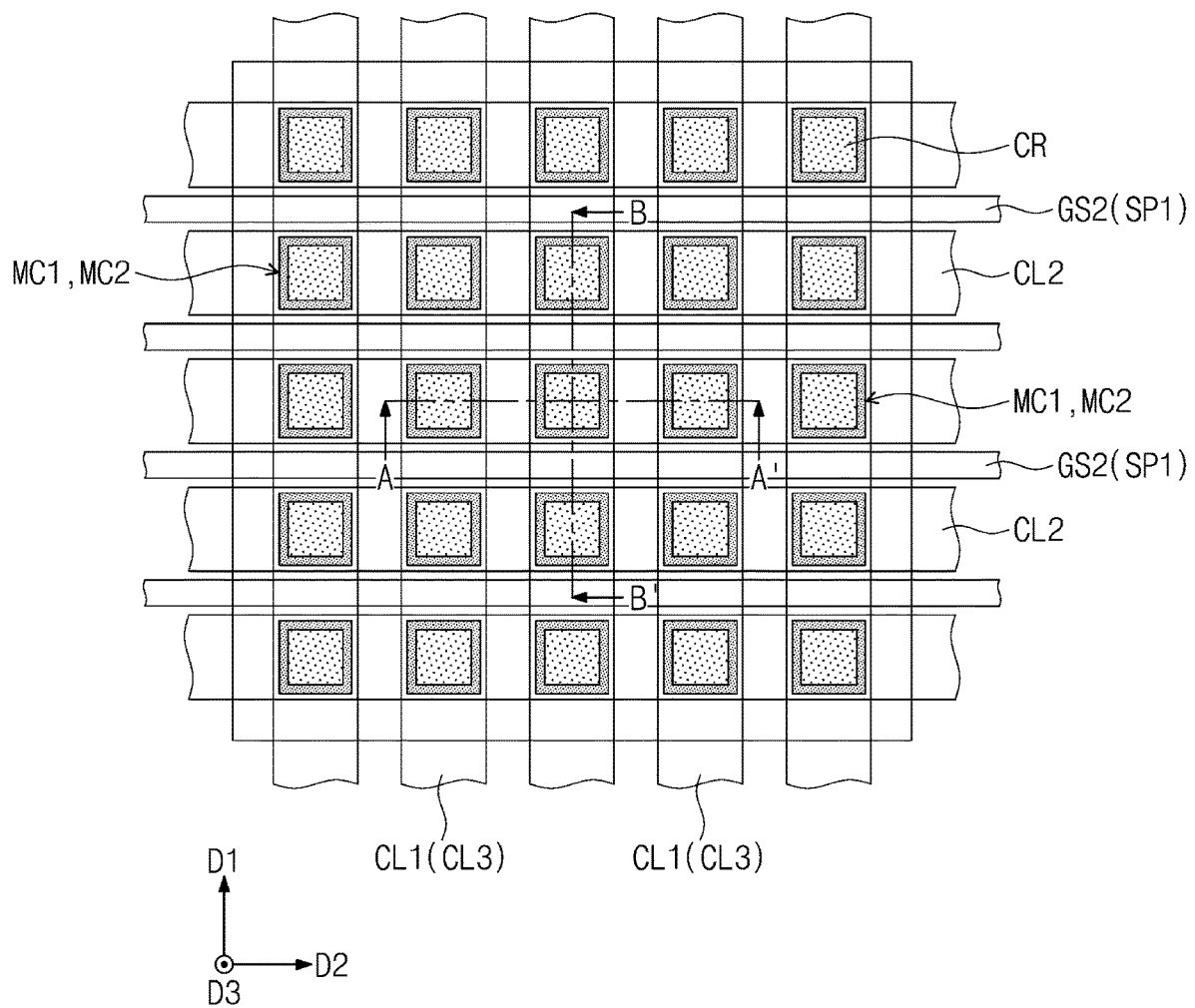
FIG. 3 illustrates a plan view showing a variable resistance memory device according to some example embodiments of the present inventive concepts.
Figure 4:
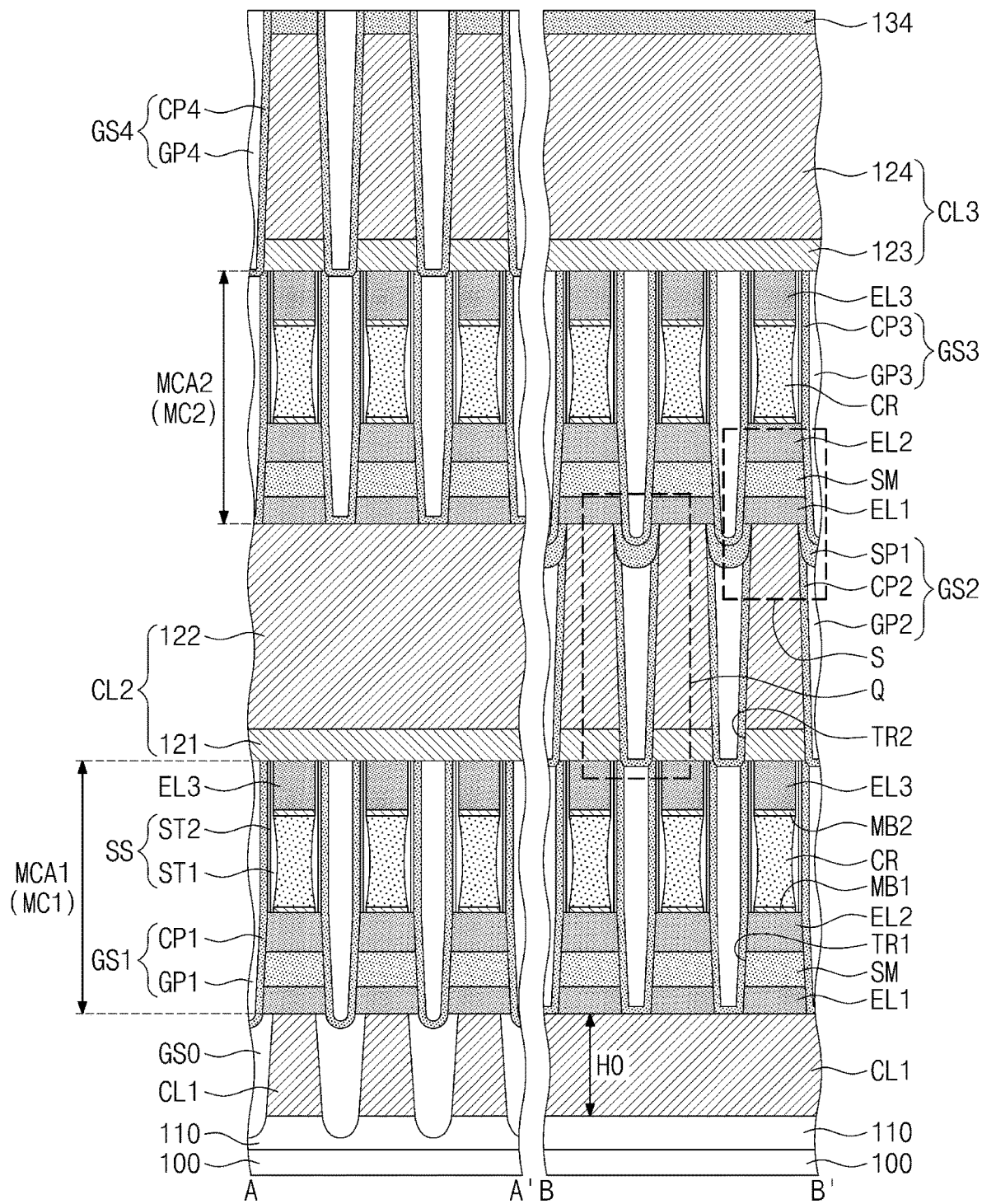
FIG. 4 illustrates a cross-sectional view taken along lines A-A' and B-B' of FIG. 3.
Figure 5:
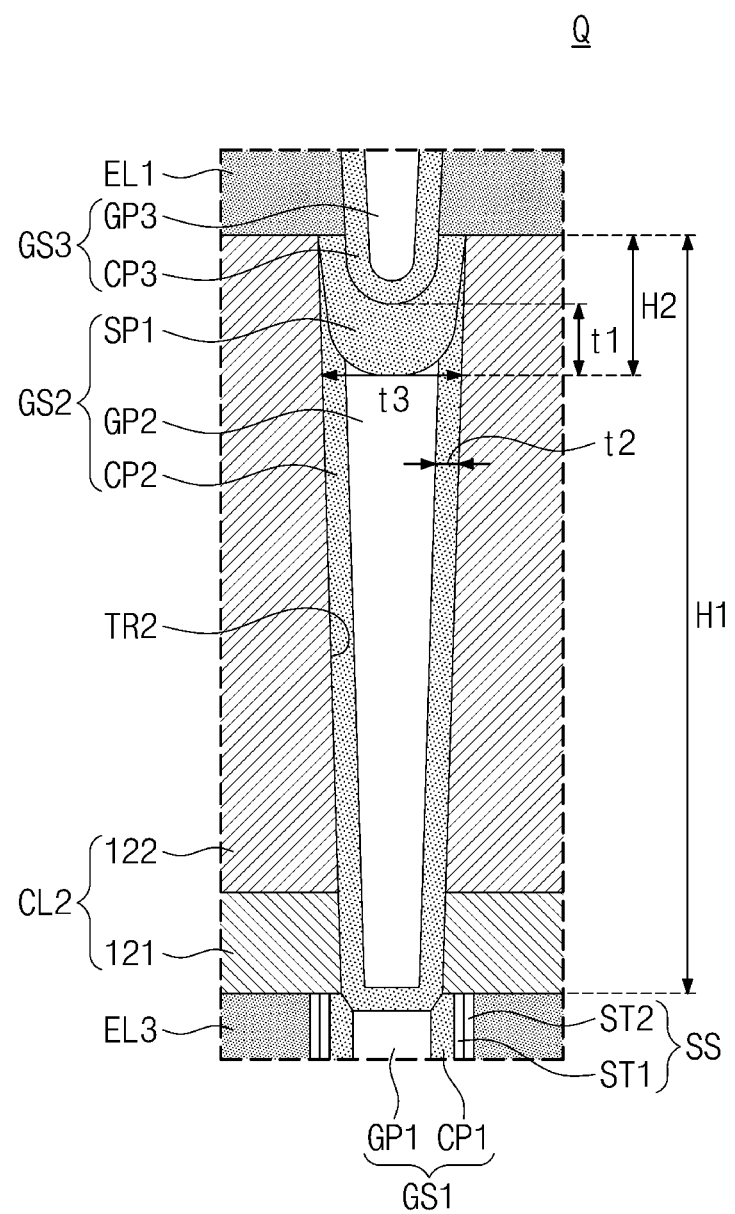
FIGS. 5, 6A, and 6B illustrate enlarged views showing section Q of FIG. 4.
Figure 6A:
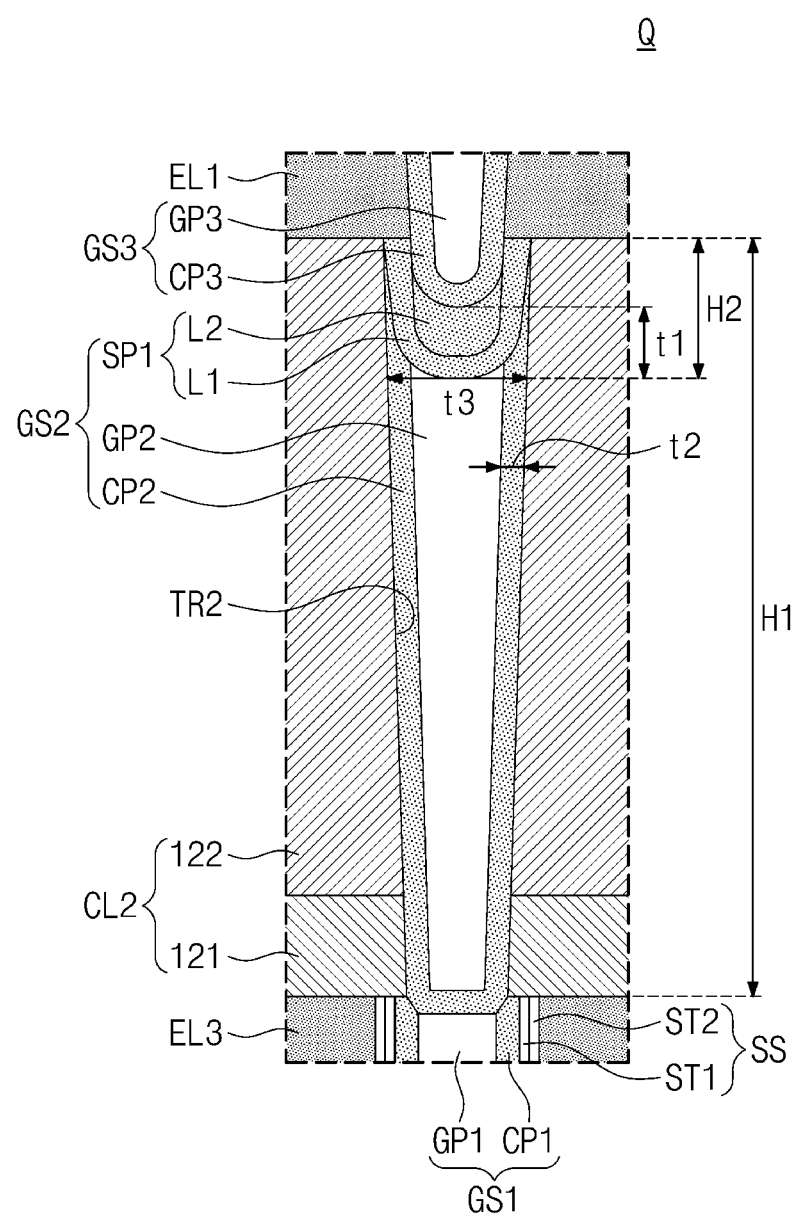
Figure 6B:
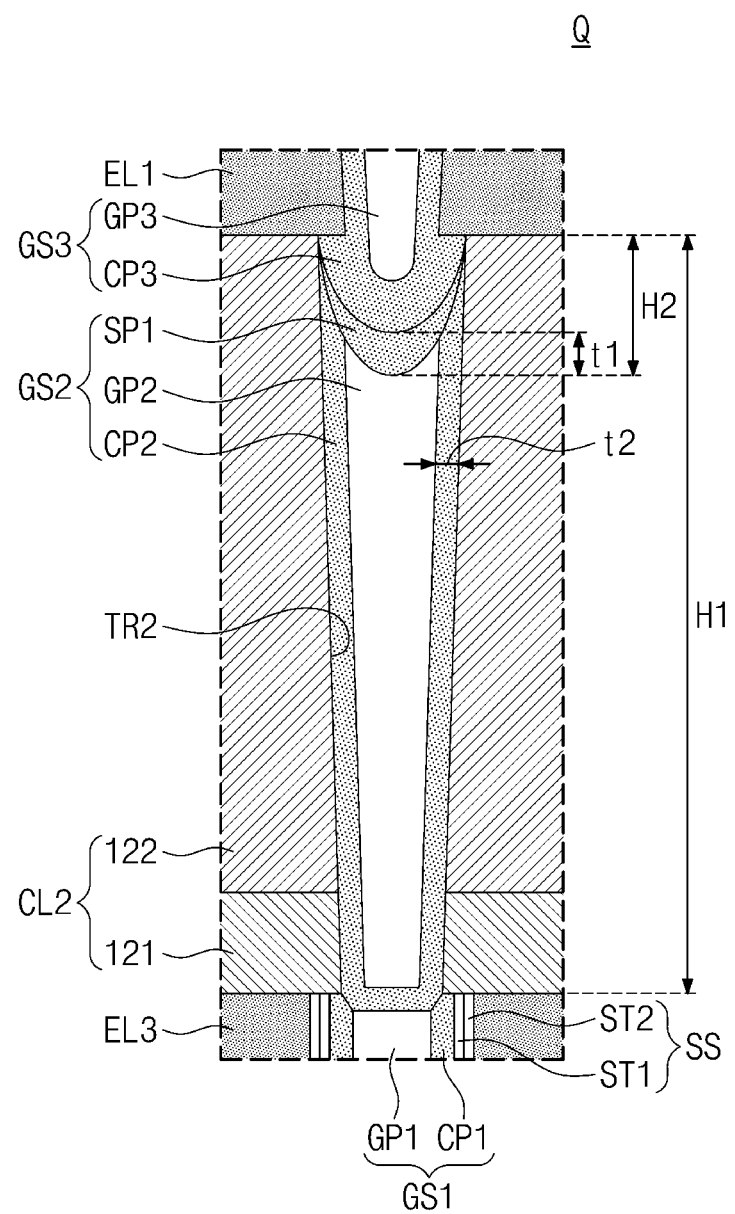
Figure 6C:
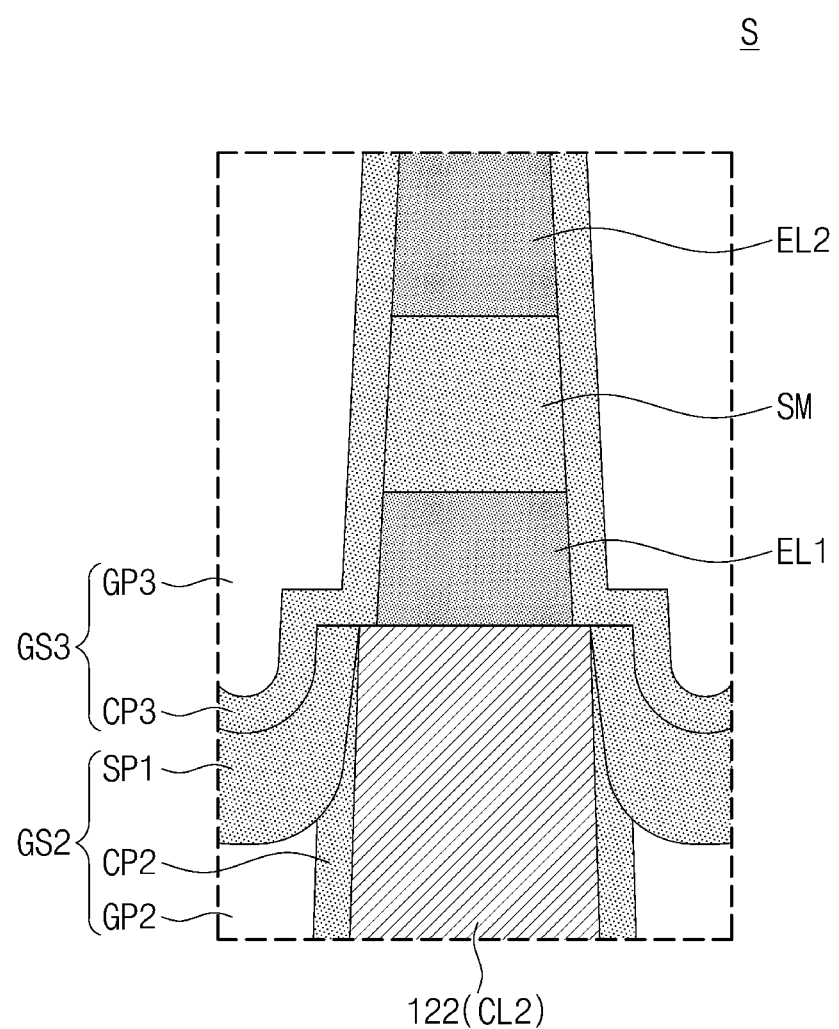
FIG. 6C illustrates an enlarged view showing section S of FIG. 4.

FIG. 3 illustrates a plan view showing a variable resistance memory device according to some example embodiments of the present inventive concepts. FIG. 4 illustrates a cross-sectional view taken along lines A-A' and B-B' of FIG. 3. FIGS. 5, 6A, and 6B illustrate enlarged views showing section Q of FIG. 4. FIG. 6C illustrates an enlarged view showing section S of FIG. 4. FIGS. 3 to 5 and 6A to 6C show embodiments each including two memory cell stacks, but the present inventive concepts are not limited thereto.

Referring to FIGS. 3 to 5, a variable resistance memory device may include a plurality of memory cell stacks MCA1 and MCA2 sequentially stacked. For example, the memory cell stacks MCA1 and MCA2 may correspond to the memory cell stacks discussed with reference to FIGS. 1 and 2. The first memory cell stack MCA1 may be disposed between first conductive lines CL1 and second conductive lines CL2 sequentially provided on the substrate 100. The first memory cell stack MCA1 may include first cell structures MC1 provided at intersections between the first conductive lines CL1 and the second conductive lines CL2. The second memory cell stack MCA2 may be disposed between the second conductive lines CL2 and third conductive lines CL3 provided on the second conductive lines CL2. The second memory cell stack MCA2 may include second cell structures MC2 provided at intersections between the second conductive lines CL2 and the third conductive lines CL3. Although FIG. 3 depicts that each of the first and second cell structures MC1 and MC2 has a quadrangle shape, each of the first and second cell structures MC1 and MC2 may have a round shape, a circular shape, or any other suitable shape without being limited thereto.

The first conductive lines CL1 may extend along a first direction D1 substantially parallel to a top surface of the substrate 100, and the second conductive lines CL2 may extend along a second direction D2 that crosses the first direction D1 and is substantially parallel to the top surface of the substrate 100. For example, the second direction D2 may be perpendicular to the first direction D1. The third conductive lines CL3 may extend along the first direction D1 to be substantially parallel to the first conductive lines CL1. The first, second, and third conductive lines CL1, CL2, and CL3 may include a conductive material, such as tungsten, copper, or aluminum. The first, second, and third conductive lines CL1, CL2, and CL3 may further include a conductive metal nitride, such as TiN or WN.

The first conductive lines CL1 may have a height H0 in a third direction D3 perpendicular to the top surface of the substrate 100, which the height H0 may be less than a height H1 of the second conductive lines CL2. For example, the height H0 of the first conductive lines CL1 may be equal to or less than half the height H1 of the second conductive lines CL2. For example, the height H1 of the second conductive lines CL2 may range from about 700 Å to about 1,100 Å. The height H0 of the first conductive lines CL1 may range from about 300 Å to about 500 Å. Each of the first conductive lines CL1 may have a width in the second direction D2 that decreases as approaching a top surface thereof from a bottom surface thereof. A description about the second conductive lines CL2 may be identically applicable to the third conductive lines CL3 and other conductive lines which will be discussed below. The first conductive lines CL1 may have a sidewall slope less than that of the second conductive lines CL2. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

An interlayer dielectric layer 110 may be provided between the substrate 100 and the first conductive lines CL1. The interlayer dielectric layer 110 may include at least one selected from silicon oxide, silicon nitride, and silicon oxynitride. Lower buried structures GS0 may be provided to fill regions between the first conductive lines CL1 and to extend in the first direction D1 along the first conductive lines CL1. When viewed in plan, each of the lower buried structures GS0 may have a bar or linear shape (e.g., a straight line shape) that extends in the first direction D1. The lower buried structures GS0 may include at least one selected from silicon oxide, silicon nitride, and silicon oxynitride. The lower buried structures GS0 may extend into an upper portion of the interlayer dielectric layer 110. For example, the lower buried structures GS0 may have their lower portions inserted into to an upper portion of the interlayer dielectric layer 110.

Each of the first cell structures MC1 may include a switching pattern SM and a variable resistance pattern CR on the switching pattern SM. First electrodes EL1 may be provided between the switching patterns SM and the first conductive lines CL1. First metal patterns MB1 may be provided between the switching patterns SM and the variable resistance patterns CR. Second electrodes EL2 may be provided between the switching patterns SM and the first metal patterns MB1. Third electrodes EL3 may be provided between the variable resistance patterns CR and the second conductive lines CL2. Second metal patterns MB2 may be provided between the third electrodes EL3 and the variable resistance patterns CR. For example, each of the first cell structures MC1 may include the first electrode EL1, the switching pattern SM, the second electrode EL2, the first metal pattern MB1, the variable resistance pattern CR, the second metal pattern MB2, and the third electrode EL3, which are sequentially stacked on the first conductive line CL1. Although the following description will focus on the first cell structures MC1, the second cell structures MC2 and other cell structures may have the same structure as that of the first cell structures MC1.

The following will describe an example in which the switching patterns SM may be disposed between the first electrodes EL1 and the second electrodes EL2, and in which the variable resistance patterns CR may be disposed between the second electrodes EL2 and the third electrodes EL3, or alternatively in which the variable resistance patterns CR may be disposed between the first electrodes EL1 and the second electrodes EL2, and the switching patterns SM may be disposed between the second electrodes EL2 and the third electrodes EL3.

The variable resistance patterns CR may be formed of any one or more of materials that have physical properties capable of storing data. In the case where a phase change memory device is adopted as the variable resistance memory device according to some example embodiments of the present inventive concepts, the variable resistance patterns CR may include a material whose phase is reversibly changed between a crystalline state and an amorphous state based on temperature. For example, the variable resistance patterns CR may have a phase transition temperature of from about 250° C. to about 350° C. to induce a phase transition between crystalline and amorphous states. The variable resistance patterns CR may be formed of a compound in which at least one selected from Te, Se, and S as chalcogen elements is combined with at least one selected from Ge, Sb, Bi, Pb, Sn, Ag, As, Si, In, Ti, Ga, P, O, and C. For example, the variable resistance patterns CR may include at least one selected from a binary material such as GeTe, GeSe, GeS, SbSe, SbTe, SbS, SnSb, InSe, InSb, AsTe, AlTe, GaSb, AlSb, BiSb, ScSb, Ysb, CeSb, DySb, and NdSb, a ternary material such as GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YsbSe, YsbS, CeSbTe, CeSbSe, CeSbS, DySbTe, DySbSe, DySbS, NdSbTe, NdSbSe, and NdSbS, a quaternary material such as GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YgeSbTe, YgeSbSe, YgeSbS, CeGeSbTe, CeGeSbSe, CeGeSbS, DyGeSbTe, DyGeSbSe, DyGeSbS, NdGeSbTe, NdGeSbSe, and NdGeSbS, and a quinary material such as InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeSn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeZnSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, and GeSbSeZnSn. The variable resistance patterns CR may be formed of either a single layer including one of the above materials or a plurality of layers including the above materials different from each other. Alternatively, the variable resistance patterns CR may include a superlattice structure in which a Ge-containing layer and a Ge-free layer are repeatedly stacked. For example, the variable resistance patterns CR may have a structure in which a GeTe layer and an $Sb_2Te_3$ layer are repeatedly stacked, or in which a GeTe layer and a $Bi_2Te_3$ layer are repeatedly stacked. Additionally, the variable resistance patterns CR may further include at least one selected from B, C, N, O, P, Cd, W, Ti, Hf, and Zr, which is added to the above materials.

The variable resistance patterns CR may have recessed regions on their sidewalls. The recessed regions may each be a region produced when the sidewall of the variable resistance pattern CR is recessed inwardly from a sidewall of the first metal pattern MB1 and a sidewall of the second metal pattern MB2. The sidewalls of the variable resistance patterns CR with the recessed regions may have a concave profile.

The switching patterns SM may be Ovonic threshold switch (OTS) devices having bi-directional characteristics. For example, the switching patterns SM may be devices based on a threshold switching phenomenon exhibiting a nonlinear I-V curve (e.g., S-type I-V curve). The switching patterns SM may be associated with a phase transition temperature between crystalline and amorphous states that is greater than a phase transition temperature associated with the variable resistance patterns CR. For example, the switching patterns SM may have a phase transition temperature of from about 350° C. to about 450° C., which is greater than the phase transition temperature of the variable resistance patterns CR. The phase transition temperature of the variable resistance patterns CR may range from about 250° C. to about 350° C. When operating the variable resistance memory device according to some example embodiments of the present inventive concepts, the variable resistance patterns CR may be configured to reversibly change their phases between crystalline and amorphous states under operating voltages, while the switching patterns SM may maintain their substantially amorphous states without the phase transition under the operating voltages. In this description, the phrase "substantially amorphous state" does not exclude the presence of a locally crystalline grain boundary or a locally crystalline portion in a target object.

The switching patterns SM may be formed of a compound in which at least one selected from Te, Se, and S as chalcogen elements is combined with at least one selected from Ge, Sb, Bi, Al, Pb, Sn, Ag, As, Si, In, Ti, Ga, and P. For example, the switching patterns SM may include at least one selected from a binary material such as GeSe, GeS, AsSe, AsTe, AaS SiTe, SiSe, SiS, GeAs, SiAs, SnSe, and SnTe, a ternary material such as GeAsTe, GeAsSe, AlAsTe, AlAsSe, SiAsSe, SiAsTe, GeSeTe, GeSeSb, GaAsSe, GaAsTe, InAsSe, InAsTe, SnAsSe, and SnAsTe, a quaternary material such as GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, and GeAsTeZn, a quinary material such as GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, and GeAsSeZnSn, and a senary material such as GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeIn, GeSiAsSeGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, and GeAsSeSAlSn.

The switching patterns SM may be formed of either a single layer including one of the above materials or a plurality of layers including the above materials different from each other. Additionally, the switching patterns SM may further include at least one selected from B, C, N, and O, which is added to the above materials.

The first, second, and third electrodes EL1, EL2, and EL3 may include a conductive material. For example, the first, second, and third electrodes EL1, EL2, and EL3 may each be a carbon-containing electrode. The first, second, and third electrodes EL1, EL2, and EL3 may include one or more of metal and a metal nitride. Each of the first electrodes EL1 may have a width substantially the same as or greater than that of the second conductive line CL2 below the first electrode ELL Alternatively, as shown in FIG. 6C, each of the first electrodes EL1 may have a width less than that of the second conductive line CL2 below the first electrode EL1.

The first metal patterns MB1 and the second metal patterns MB2 may cover top and bottom surfaces of the variable resistance patterns CR, thereby preventing diffusion of materials included in the variable resistance patterns CR. The first metal patterns MB1 may be provided between the variable resistance patterns CR and the switching patterns SM, thereby reducing contact resistances. The first and second metal patterns MB1 and MB2 may include at least one selected from W, Ti, Al, Cu, C, CN, TiN, TiAlN, TiSiN, TiCN, WN, CoSiN, WSiN, TaN, TaCN, and TaSiN.

The first cell structures MC1 may include spacer structures SS. Each of the spacer structures SS may cover a sidewall of each of the first metal pattern MB1, the second metal pattern MB2, the variable resistance pattern CR, and the third electrode EL3. The spacer structures SS may have their bottom surfaces that are in contact with top surfaces of the second electrodes EL2. The spacer structures SS may include at least one selected from a silicon oxide layer, a silicon nitride layer, and a silicon oxynitride layer. For example, the spacer structures SS may include first spacers ST1 and second spacers ST2 that include a different material from that of the first spacers ST1. The first spacers ST1 may fill the recessed regions of the variable resistance patterns CR. The second spacers ST2 may cover sidewalls of the first spacers ST1. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present.

The first cell structures MC1 may be two-dimensionally arranged to be spaced apart from each other in the first and second directions D1 and D2. A first trench TR1 may separate the first cell structures MC1 from each other, and the first trench TR1 may have a lattice or mesh shape that extends in the first and second directions D1 and D2.

The first cell structures MC1 may be provided therebetween with a first buried structure GS1 that fills the first trench TR1. When viewed in plan, the first buried structure GS1 may have a lattice or mesh shape including parts that extend in the first direction D1 and parts that extend in the second direction D2. The first buried structure GS1 may include a first liner pattern CP1 and a first filling pattern GP1. For example, the first liner pattern CP1 may conformally cover sidewalls of the first cell structures MC1. The first liner pattern CP1 may have a bottom surface that is in contact with a top surface of the lower buried structure GS0 and the top surface of the first conductive line CL1. The first liner pattern CP1 may have its parts connected to the top surfaces of the lower buried structures GS0, and the parts of the first liner patterns CP1 may extend downwards below the top surfaces of the first conductive lines CL1. For example, the first liner pattern CP1 may have a lower portion inserted into an upper portion of the lower buried structure GS0. The first filling pattern GP1 may be provided on the first liner pattern CP1. The first filling pattern GP1 may be spaced apart from the first cell structure MC1 across the first liner pattern CP1. In an exemplary embodiment, the first liner pattern CP1 may be interposed between the first filling pattern GIP and the first cell structure MC1.

The first liner pattern CP1 may include at least one selected from SiN, SiO$_2$, SiON, SiBN, SiCN, SIOCN, Al$_2$O$_3$, AlN, and AlON. The first filling pattern GP1 may include at least one selected from SiN, SiON, SiC, SiCN, SiOC, SiOCN, SiO$_2$, and Al$_2$O$_3$.

Each of the second conductive lines CL2 may include a barrier pattern 121 and a metal pattern 122. Each of the third conductive lines CL3 may include a barrier pattern 123 and a metal pattern 124. The barrier patterns 121 and 123 may include a metal nitride, such as TiN, WN, or TaN. The metal patterns 122 and 124 may include metal, such as tungsten, titanium, or tantalum. The barrier patterns 121 and 123 may have a thickness of from about 1/20 to about 1/7 times a thickness of the metal patterns 122 and 124. The first conductive lines CL1 do not include the barrier patterns, but the present inventive concepts are not limited thereto. An upper mask pattern 134 may remain on the third conductive lines CL3, or alternatively, the upper mask pattern 134 does not remain on the third conductive lines CL3. For example, when a memory cell stack is provided on the third conductive lines CL3 as like a structure which will be discussed with reference to FIG. 12, the upper mask pattern 134 does not be provided.

The following will be discussed in detail regarding second buried structures GS2 with reference to FIGS. 4 to 6B. The second buried structures GS2 may fill second trenches TR2 between the second conductive lines CL2. The second trenches TR2 may extend in the second direction D2 and may be spaced apart from each other in the first direction D1. Each of the second buried structures GS2 may have a bar or linear shape (e.g., a straight line shape) that extends in the second direction D2. For example, the second buried structures GS2 may be separated from each other across the second conductive lines CL2. In an exemplary embodiment, each second conductive line CL2 may be disposed between two corresponding second buried structures GS2 which are adjacent to each other. Each of the second buried structures GS2 may include a second liner pattern CP2, a second filling pattern GP2, and a first capping pattern SP1. The second liner pattern CP2 may cover sidewalls of a pair of second conductive lines CL2 adjacent to each other, and may also cover a top surface of the first buried structure GS1 exposed between the pair of second conductive lines CL2. For example, the second liner pattern CP2 may have a bottom surface that is in contact with the first liner pattern CP1 and the first filling pattern GP1. The second liner pattern CP2 may be in contact with top surfaces of the first cell structures MC1, for example, top surfaces of the third electrodes EL3, but the present inventive concepts are not limited thereto. The second liner pattern CP2 may extend in the second direction D2.

The second filling pattern GP2 may have a lower portion that fills a lower portion of the second trench TR2, and may also have an upper portion that contacts a bottom surface of the first capping pattern SP1. When viewed in cross-section, the second filling pattern GP2 may be surrounded by the second liner pattern CP2 and the first capping pattern SP1. The second filling pattern GP2 may extend in the second direction D2.

The first capping pattern SP1 may extend in the second direction D2 between the second conductive lines CL2, and may be spaced apart from each other in the first direction D1. The first capping pattern SP1 may have a convex shape toward the first cell structures MC1 or the substrate 100. In an exemplary embodiment, a bottom surface of the capping pattern SP1 may be in contact with the second filling pattern GP2 (e.g., a top surface of the second filling pattern GP2), and the bottom surface of the capping pattern SP1 may be convex toward the second filling pattern GP2. For example, the first capping pattern SP1 may have the bottom and/or top surfaces each having a cross-section that is convex toward the substrate 100. For example, the bottom surface of the first capping pattern SP1 may have a shape the same as that depicted in FIGS. 5 and 6, or alternatively may have a shape whose curvature is relatively small as shown in FIG. 6B.

The bottom surface of the first capping pattern SP1 may be in contact with a top surface of the second filling pattern GP2 and a top surface of the second liner pattern CP2, or alternatively is not in contact with the top surface of the second liner pattern CP2. The first capping pattern SP1 may have a thickness t1 greater than a thickness t2 of the second liner pattern CP2. For example, the thickness t1 of the first capping pattern SP1 may range from about 40 Å to about 90 Å.

The first capping pattern SP1 may have the lowermost portion at a level equal to or greater than about ⅔ times the height H1 of the second conductive lines CL2. In an exemplary embodiment, the first capping pattern SP1 may have the lowermost bottom surface positioned at a level which is equal to or greater than about ⅔ times the height H1 of the second conductive lines CL2. For example, a distance H2 from the top surfaces of the second conductive lines CL2 to the lowermost portion (e.g., the lowermost bottom surface) of the first capping pattern SP1 may correspond to a value of from about 50 Å to about 150 Å. The present invention is not limited thereto. In an exemplary embodiment, the distance H2 may range between from about 50 Å to about 300 Å.

The second liner pattern CP2, the second filling pattern GP2, and the first capping pattern SP1 may include different materials from each other. The second liner pattern CP2 may include at least one selected from SiN, SiO$_2$, SiON, SiBN, SiCN, SIOCN, Al$_2$O$_3$, AlN, and AlON. The second filling pattern GP2 may include at least one selected from SiN, SiON, SiC, SiCN, SiOC, SiOCN, SiO$_2$, and Al$_2$O$_3$. The first capping pattern SP1 may include at least one selected from SiN, SiO$_2$, SiON, SiBN, SiCN, SIOCN, Al$_2$O$_3$, AlN, and AlON.

For example, the second filling pattern GP2 may have a carbon concentration higher than that of the first capping pattern SP1. The first capping pattern SP1 may have a dielectric constant greater than that of the second filling pattern GP2. For example, the second filling pattern GP2 may include silicon oxycarbide (SiOC). For example, the first capping pattern SP1 may be a single layer including one of SiO$_2$, SiN, and SiON. Alternatively, the first capping pattern SP1 may have a multi-layered structure (i.e., a multi-layered pattern) in which a plurality of single layers are stacked on each other. Each layer of the multi-layered pattern may include one of SiO$_2$, SiN, and SiON. For example, as shown in FIG. 6A, the first capping pattern SP1 may include a first layer L1 and a second layer L2 that include different materials from each other. For example, the first layer L1 may include one of SiO$_2$, SiN, and SiON, and the second layer L2 may include another of SiO$_2$, SiN, and SiON. The second layer L2 may have a thickness greater than that of the first layer L1. For example, the second layer L2 may have a thickness equal to or greater than twice that of the first layer L1.

A third buried structure GS3 may be provided to fill regions between the second cell structures MC2. The third buried structure GS3 may have a lattice or mesh shape including parts that extend in the first direction D1 and parts that extend in the second direction D2. The third buried structure GS3 may include a third liner pattern CP3 and a third filling pattern GP3. For example, the third liner pattern CP3 may conformally cover sidewalls of the second cell structures MC2. The third liner pattern CP3 may include at least one selected from SiN, SiO$_2$, SiON, SiBN, SiCN, SIOCN, Al$_2$O$_3$, AN, and AlON. The third filling pattern GP3 may include at least one selected from SiN, SiON, SiC, SiCN, SiOC, SiOCN, SiO$_2$, and Al$_2$O$_3$.

The third liner pattern CP3 may have a bottom surface that is in contact with top surfaces of the second buried structures GS2 and top surfaces of the second conductive lines CL2. The third liner pattern CP3 may have its portions connected to the top surfaces of the second buried structures GS2, which portions may extend downwards below the top surfaces of the second conductive lines CL2. For example, the third liner pattern CP3 may have a lower portion inserted between the second conductive lines CL2. The thickness t1 in the third direction D3 of the first capping pattern SP1 may be less than a width t3 in the first direction D1 of the second buried structures GS2 at a level of the bottom surface of the first capping pattern SP1. For example, the second layer L2 may have a thickness equal to or greater than four times that of the first layer L1.

Fourth buried structures GS4 may be provided to fill regions between the third conductive lines CL3. Each of the fourth buried structures GS4 may have a bar or linear shape (e.g., a straight line shape) that extends in the first direction D1. For example, the fourth buried structures GS4 may be separated from each other across the third conductive lines CL3. In an exemplary embodiment, each third conductive line CL3 may be disposed between two corresponding fourth buried structures which are adjacent to each other. Each of the fourth buried structures GS4 may include a fourth liner pattern CP4 and a fourth filling pattern GP4. Except explicitly stated differently, the description about the second liner pattern CP2 and the second filling pattern GP2 may be identically applicable to the fourth liner pattern CP4 and the fourth filling pattern GP4, respectively. Unlike the second buried structure GS2, the fourth buried structure GS4 may include no capping pattern. Alternatively, such as a structure which will be discussed with reference to FIG. 12, the fourth buried structure GS4 may include a capping pattern.

Each of the first to fourth buried structures GS1 to GS4 has not therein a non-solid region, such as air gap, seam, and void, or alternatively may have a non-solid region therein. The term "air" as discussed herein, may refer to atmospheric air, or other gases that may be present during the manufacturing process.

Figure 7:
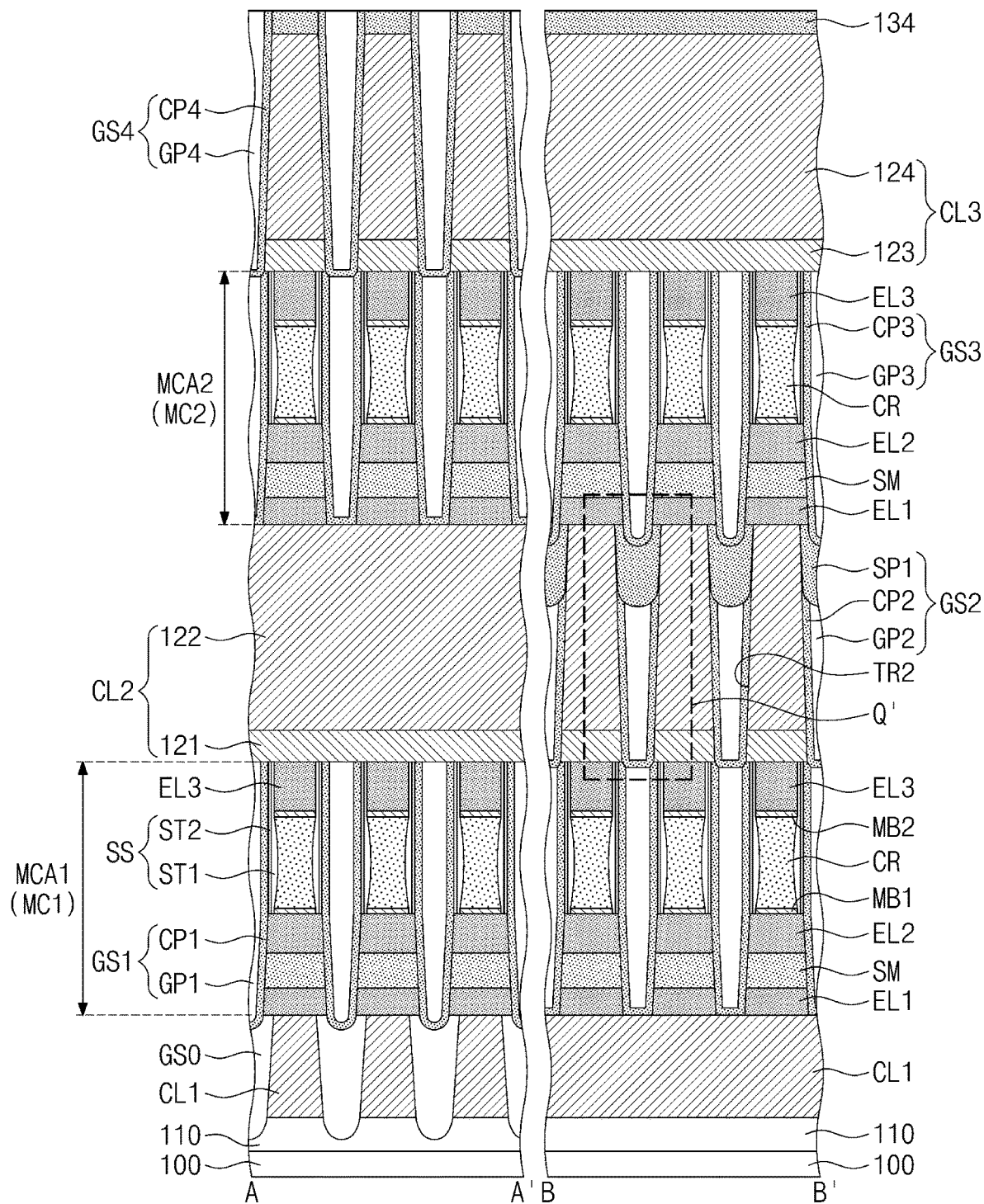
FIG. 7 illustrates a cross-sectional view taken along lines A-A' and B-B' of FIG. 3, showing a variable resistance memory device according to some example embodiments of the present inventive concepts.
Figure 8:
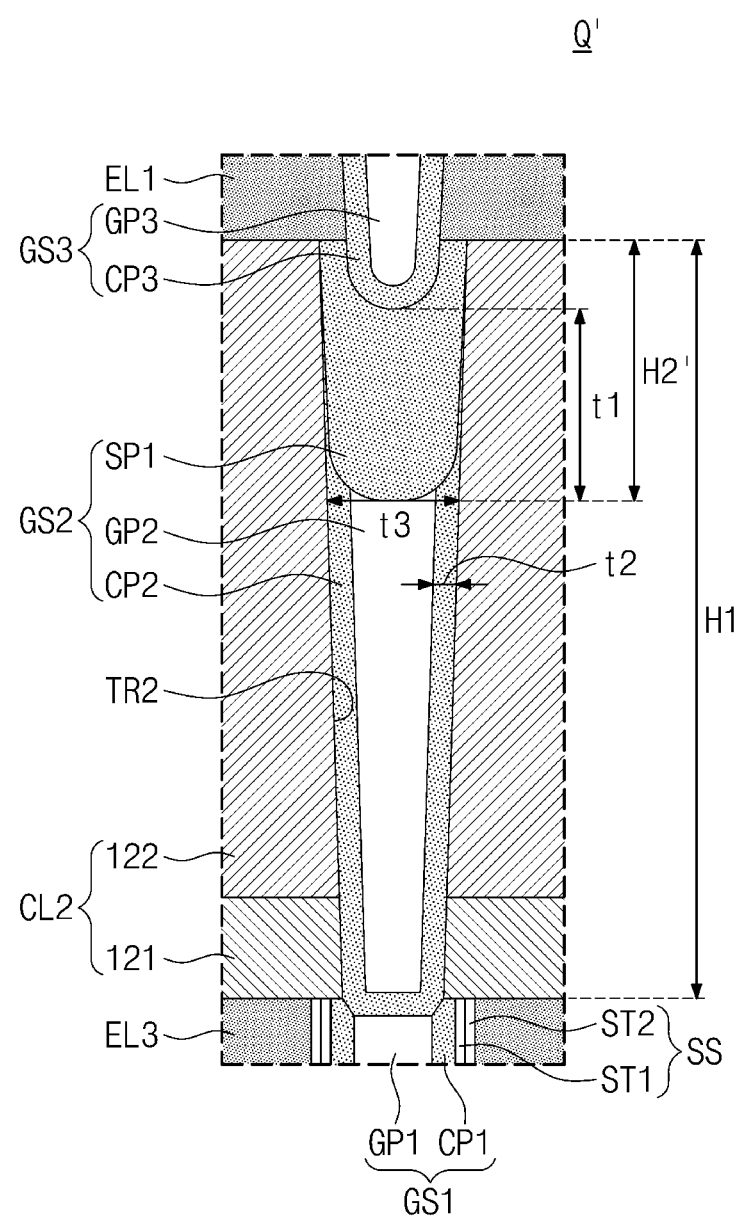
FIGS. 8 and 9 illustrate enlarged views showing section Q' of FIG. 7.
Figure 9:
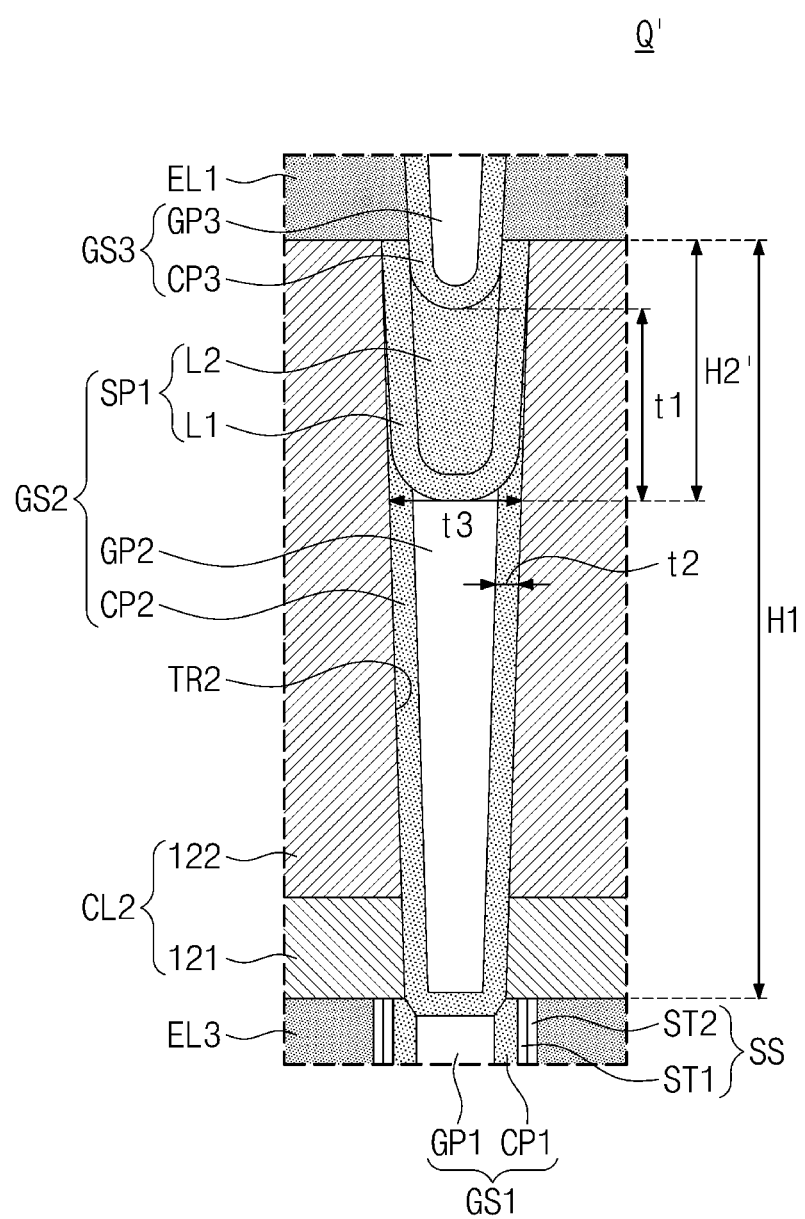

FIG. 7 illustrates a cross-sectional view taken along lines A-A' and B-B' of FIG. 3, showing a variable resistance memory device according to some example embodiments of the present inventive concepts. FIGS. 8 and 9 illustrate enlarged views showing section Q' of FIG. 7. For brevity of description, explanations of duplicate components will be omitted.

Referring to FIGS. 7 to 9, the thickness t1 in the third direction D3 of the first capping pattern SP1 may be greater than the width t3 in the first direction D1 of the second buried structures GS2 at a level of the bottom surface of the first capping pattern SP1. For example, the thickness t1 of the first capping pattern SP1 may range from about 200 Å to about 280 Å. The first capping pattern SP1 may have the lowermost portion (e.g., the lowermost bottom surface) at a level which is equal to or greater than about ⅔ times the height H1 of the second conductive lines CL2. For example, a distance H2' from the top surfaces of the second conductive lines CL2 to the lowermost portion (e.g., the lowermost bottom surface) of the first capping pattern SP1 may correspond to a value of from about 250 Å to about 350 Å. The present invention is not limited thereto. In an exemplary embodiment, the distance H2' may range between from about 50 Å to about 300 Å.

The first capping pattern SP1 may be a single layer including one of SiO$_2$, SiN, and SiON, or as shown in FIG.

9, the first capping pattern SP1 may include a first layer L1 and a second layer L2 including different materials from each other. For example, the first layer L1 may include one of $SiO_2$, SiN, and SiON, and the second layer L2 may include another of $SiO_2$, SiN, and SiON. The second layer L2 may have a thickness greater than that of the first layer L1.

Figure 10:
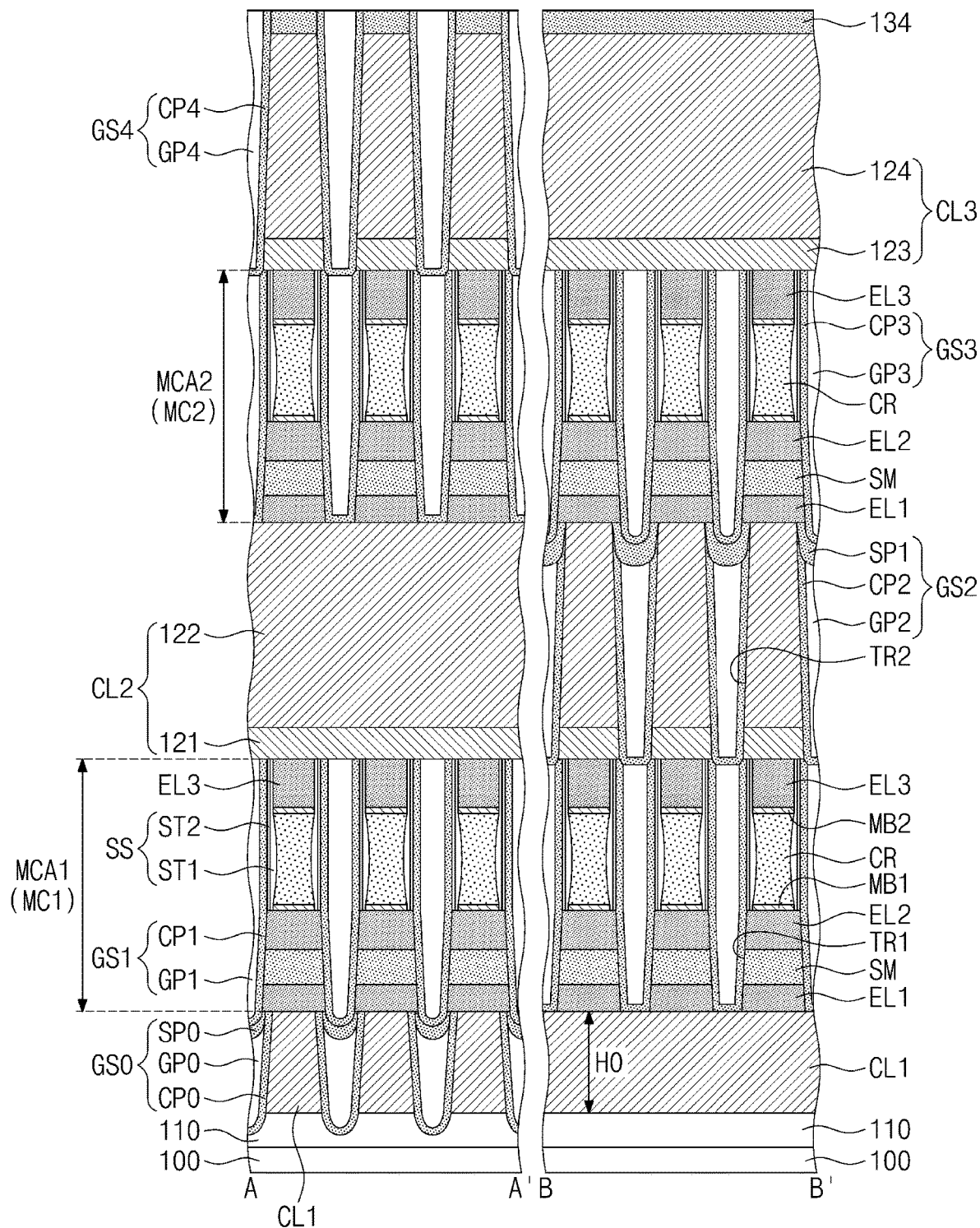
FIG. 10 illustrates a cross-sectional view taken along lines A-A' and B-B' of FIG. 3, showing a variable resistance memory device according to some example embodiments of the present inventive concepts.

FIG. 10 illustrates a cross-sectional view taken along lines A-A' and B-B' of FIG. 3, showing a variable resistance memory device according to some example embodiments of the present inventive concepts.

In the present embodiment, each of the lower buried structures GS0 may include a lower liner pattern CP0, a lower filling pattern GP0, and a lower capping pattern SP0. Unless otherwise noted, the description about the second buried structures GS2 may be applicable to the lower buried structures GS0. For example, the lower liner pattern CP0, the lower filling pattern GP0, and the lower capping pattern SP0 may include their materials the same as those of the second liner pattern CP2, the second filling pattern GP2, and the first capping pattern SP1, respectively. For example, the lower capping pattern SP0 may be a single layer including one of $SiO_2$, SiN, and SiON. For another example, the lower capping pattern SP0 may have a multi-layered structure (i.e., a multi-layered pattern) in which a plurality of single layers are stacked on each other. Each layer of the multi-layered pattern may include one of $SiO_2$, SiN, and SiON.

Figure 11:
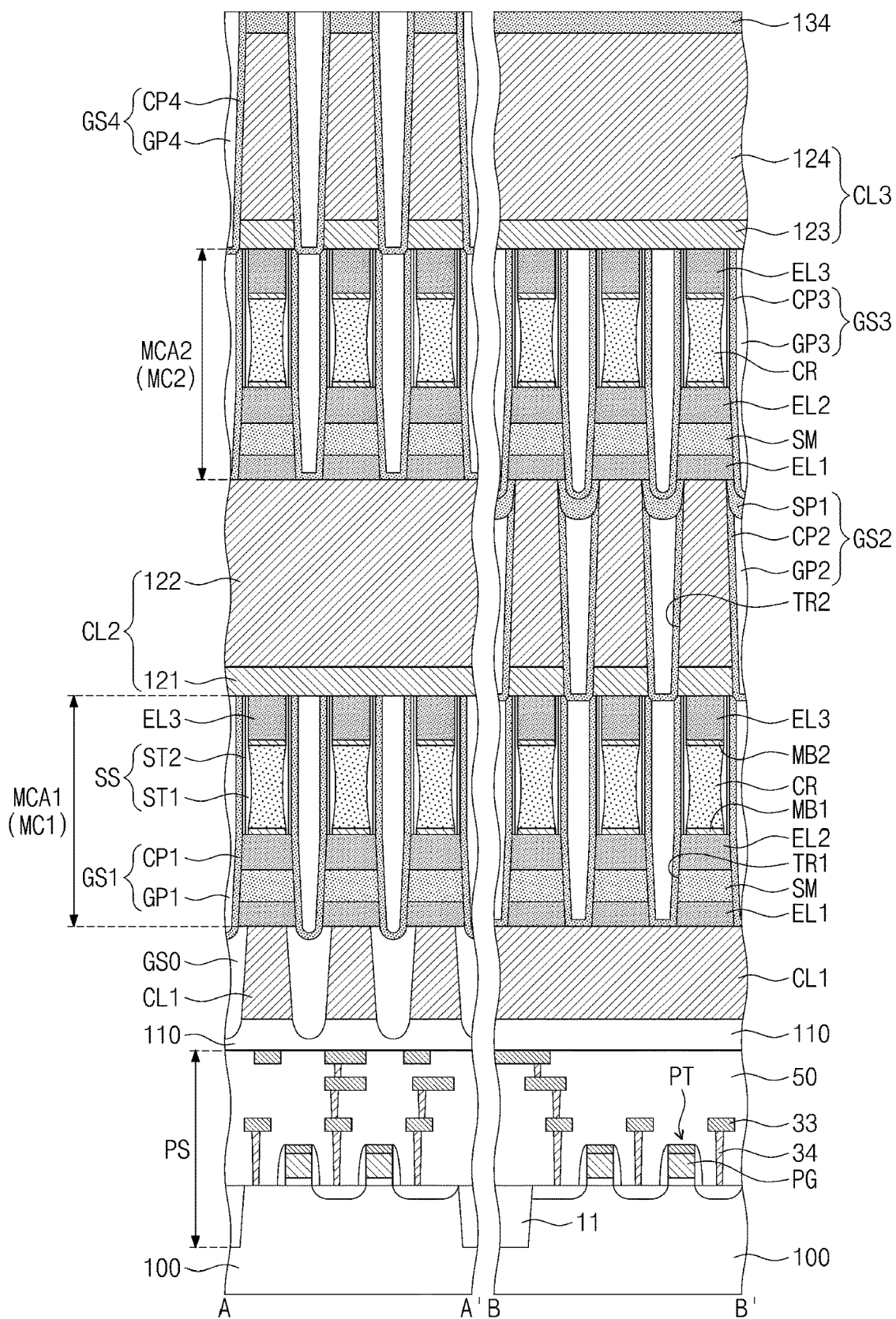
FIG. 11 illustrates a cross-sectional view taken along lines A-A' and B-B' of FIG. 3, showing a variable resistance memory device according to some example embodiments of the present inventive concepts.

FIG. 11 illustrates a cross-sectional view taken along lines A-A' and B-B' of FIG. 3, showing a variable resistance memory device according to some example embodiments of the present inventive concepts. In the present embodiment, a peripheral circuit region PS may be provided below a cell array region that includes a plurality of memory cell stacks. For example, the peripheral circuit region PS may be provided between the first memory cell stack MCA1 and the substrate 100. The peripheral circuit region PS may include peripheral logic circuits. For example, the peripheral circuit region PS may include row and column decoders, a page buffer, and a control circuit. The peripheral circuit region PS may include N-type metal oxide semiconductor (NMOS) and P-type metal oxide semiconductor (PMOS) transistors, low-voltage and high-voltage transistors, and a resistor, which are integrated on the substrate 100. For example, peripheral transistors PT may be disposed on the peripheral circuit region PS. The peripheral transistors PT may include their peripheral gate electrodes PG and active regions that are defined by a device isolation layer 11 on the substrate 100. The peripheral transistors PT may be covered with a lower interlayer dielectric layer 50. Peripheral circuit lines 33 may be electrically connected through peripheral contact plugs 34 to the peripheral transistors PT.

FIG. 12 illustrates a cross-sectional view taken along lines A-A' and B-B' of FIG. 3, showing a variable resistance memory device according to some example embodiments of the present inventive concepts. Referring to FIGS. 2, 3, and 12, a variable resistance memory device according to some example embodiments of the present inventive concepts may include first, second, third, fourth memory cell stacks MCA1, MCA2, MCA3, and MCA4 and first, second, third, fourth, and fifth conductive lines CL1, CL2, CL3, CL4, and CL5. The aforementioned description may be identically applicable to the first and second memory cell stacks MCA1 and MCA2 and the first, second, and third conductive lines CL1, CL2, and CL3.

Fourth conductive lines CL4 and fifth conductive lines CL5 may be sequentially provided on the third conductive lines CL3. A third memory cell stack MCA3 may be provided between the third conductive lines CL3 and the fourth conductive lines CL4, and a fourth memory cell stack MCA4 may be provided between the fourth conductive lines CL4 and the fifth conductive lines CL5. The third and fourth memory cell stacks MCA3 and MCA4 may have their configurations which are the same as that of the second memory cell stack MCA2. A fifth buried structure GS5 may be provided to fill regions between cell structures of the third memory cell stack MCA3, and a seventh buried structure GS7 may be provided to fill regions between cell structures of the fourth memory cell stack MCA4. The fifth and seventh buried structures GS5 and GS7 may be substantially the same as the third buried structure GS3. For example, the fifth buried structure GS5 may include a fifth liner pattern CP5 and a fifth filling pattern GP5. The seventh buried structure GS7 may include a seventh liner pattern CP7 and a seventh filling pattern GP7.

As shown on section P of FIG. 12, each of the fourth buried structures GS4 may include a second capping pattern SP2 in addition to the fourth liner pattern CP4 and the fourth filling pattern GP4. For example, a structure of section P of FIG. 12 may be substantially the same as that of section Q as shown in FIGS. 5, 6A and 6B. Sixth buried structures GS6 may be provided to fill regions between the fourth conductive lines CL4. As shown on section R of FIG. 12, each of the sixth buried structures GS6 may include a sixth liner pattern CP6, a sixth filling pattern GP6, and a third capping pattern SP3. For example, a structure of section R of FIG. 12 may be substantially the same as that of section Q as shown in FIGS. 5, 6A and 6B. The description about the first capping pattern SP1 may be identically applicable to the second capping pattern SP2 and the third capping pattern SP3.

Eighth buried structures GS8 may be provided to fill regions between the fifth conductive lines CL5. Each of the eighth buried structures GS8 may include an eighth liner pattern CP8 and an eighth filling pattern GP8.

FIGS. 13 to 22 illustrate cross-sectional views taken along lines A-A' and B-B' of FIG. 3, showing a method of fabricating a variable resistance memory device according to some example embodiments of the present inventive concepts.

Figure 13:
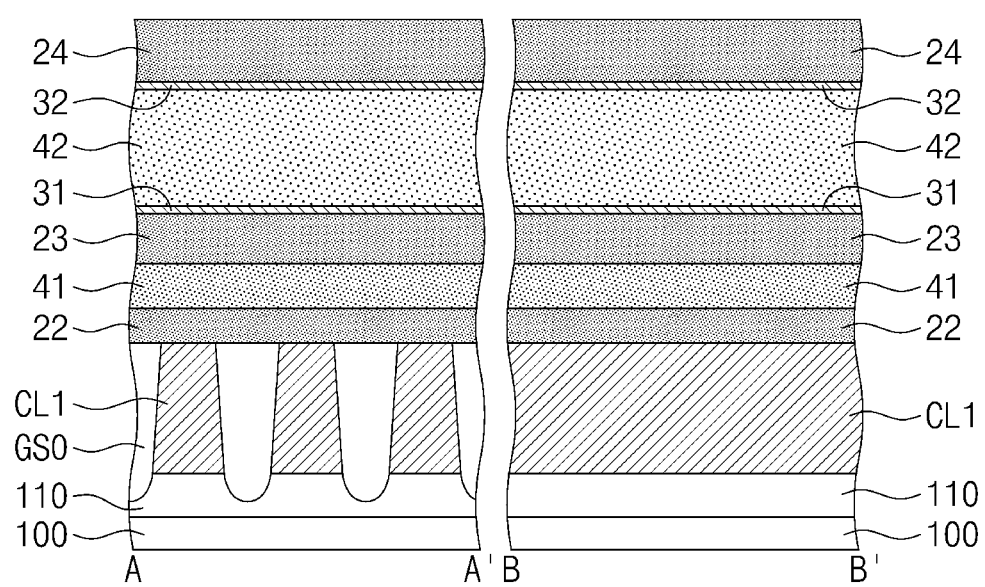
FIGS. 13 to 22 illustrate cross-sectional views taken along lines A-A' and B-B' of FIG. 3, showing a method of fabricating a variable resistance memory device according to some example embodiments of the present inventive concepts.

Referring to FIGS. 3 and 13, an interlayer dielectric layer 110 and first conductive lines CL1 may be formed on a substrate 100. The formation of the first conductive lines CL1 may include depositing a first conductive layer on the substrate 100, and etching the first conductive layer using mask patterns as an etching mask. The first conductive lines CL1 may each have a lower width greater than an upper width thereof, and also have an inclined sidewall. In an exemplary embodiment, each of the first conductive lines CL1 may have a first portion having the upper width and a second portion having the lower width which is greater than the upper width. The first portion of each of the first conductive lines CL1 may be closer to the second conductive lines CL2 than the second portion of each of the first conductive lines CL. Lower buried structures GS0 may be formed to fill regions between the first conductive lines CL1. The lower buried structures GS0 may be formed of at least one selected from silicon oxide, silicon nitride, and silicon oxynitride. Afterwards, a planarization process may be performed to expose top surfaces of the first conductive lines CL1. In an exemplary embodiment, the planarization process may include a chemical mechanical polishing (CMP) process or an etch-back process.

A second conductive layer 22, a switching layer 41, a third conductive layer 23, a first metal layer 31, a variable resistance layer 42, a second metal layer 32, and a fourth conductive layer 24 may be sequentially formed on the first conductive lines CL1. For example, the formation of the layers mentioned above may include performing at least one selected from chemical vapor deposition, sputtering, and atomic layer deposition.

Figure 14:
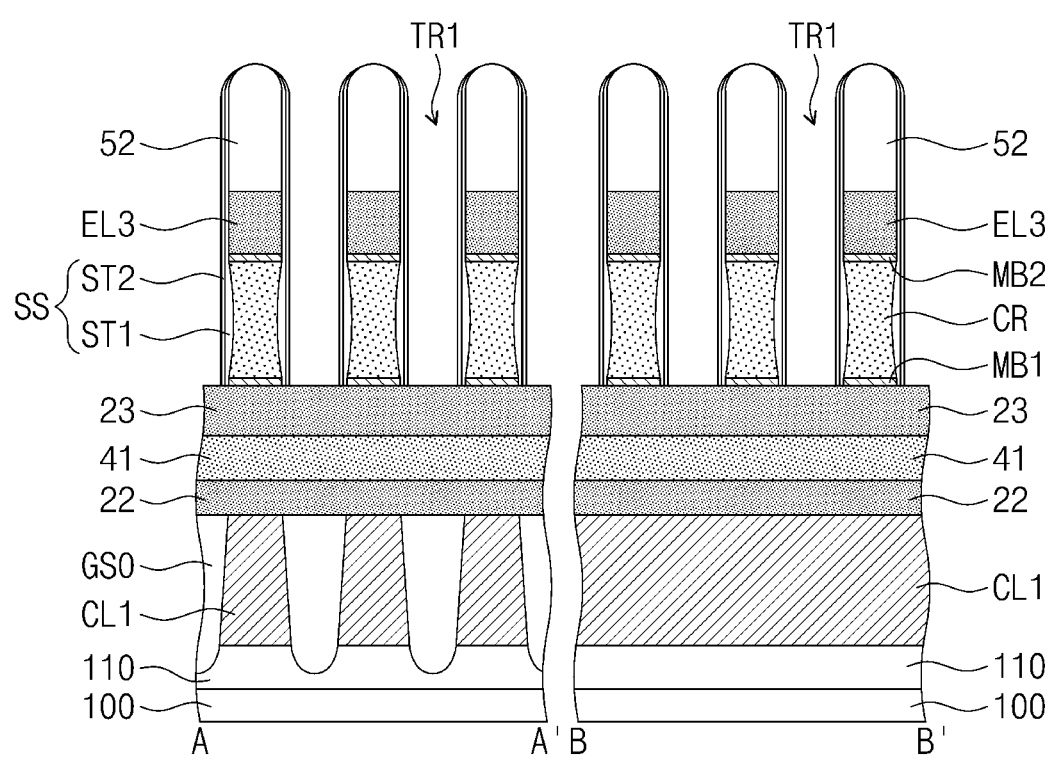

Referring to FIGS. 3 and 14, first mask patterns 52 may be formed on the fourth conductive layer 24. The first mask patterns 52 may include a silicon nitride layer, a silicon carbide layer, and/or a silicon oxynitride layer. The first mask patterns 52 may be used as an etching mask to perform an etching process in which the fourth conductive layer 24, the second metal layer 32, the variable resistance layer 42, and the first metal layer 31 are sequentially patterned to form a first trench TR1. First metal patterns MB1, variable resistance patterns CR, second metal patterns MB2, and third electrodes EL3 may be sequentially formed on the third conductive layer 23. For example, the first mask patterns 52 may be spaced apart from each other in a first direction D1 and a second direction D2. The etching process may include an ion beam etch and/or a reactive ion etch.

The recessed regions may be formed on sidewalls of the variable resistance patterns CR. For example, the recessed regions may be formed by performing a wet cleaning process that uses a cleaning solution having etch selectivity with respect to the variable resistance patterns CR. Alternatively, the formation of the recessed regions may be omitted. Spacer structures SS may be formed to cover the variable resistance patterns CR. The spacer structures SS may be formed by forming a dielectric layer that covers sidewalls of each of the first metal pattern MB1, the second metal pattern MB2, the variable resistance pattern CR, and the third electrode EL3, and then performing an anisotropic etching process. For example, the spacer structures SS may include first spacers ST1 and second spacers ST2 including a different material from that of the first spacers ST1. The spacer structures SS may be formed by atomic layer deposition and/or chemical vapor deposition.

Figure 15:
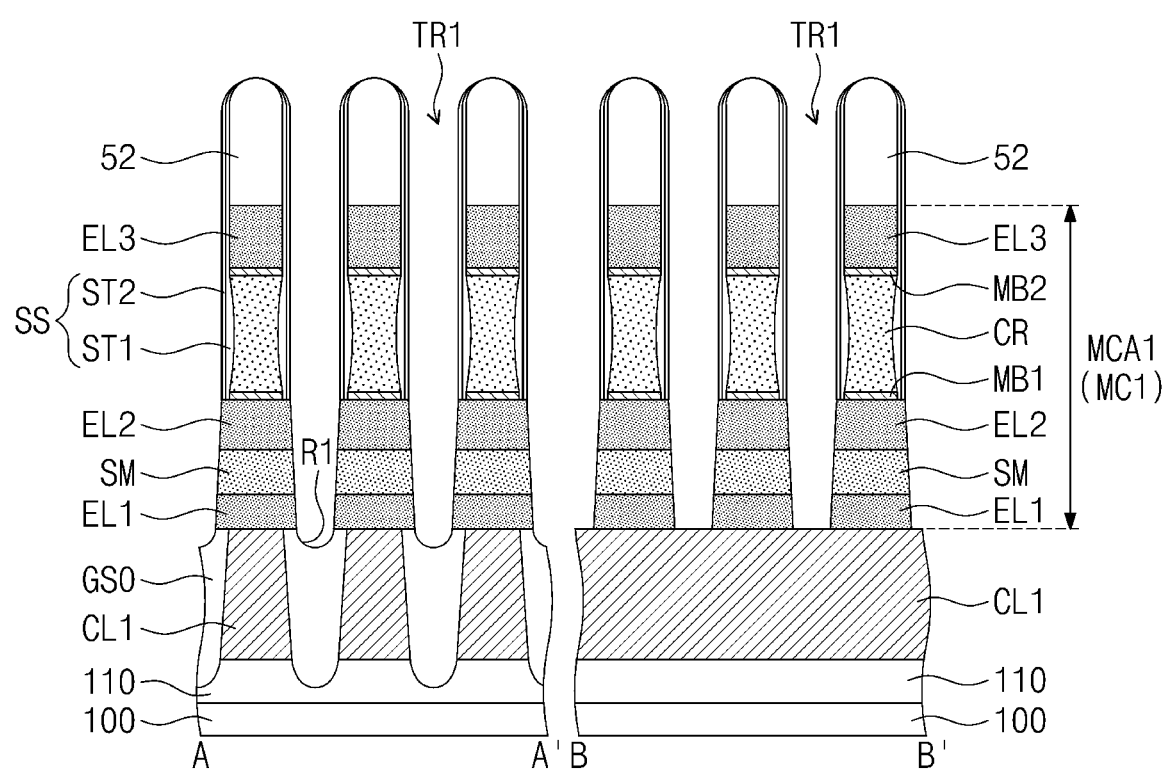

Referring to FIGS. 3 and 15, an etching process may be performed in which the third conductive layer 23, the switching layer 41, and the second conductive layer 22 are sequentially etched to form second electrodes EL2, switching patterns SM, and first electrodes EL1. A first memory cell stack MCA1 may be formed to include first cell structures MC1. The etching process may include an ion beam etch and/or a reactive ion etch. During the etching process, the first trench TR1 may further extend toward the substrate 100. For example, first recessed regions R1 may be formed on upper portions of the lower buried structures GS0.

Figure 16:
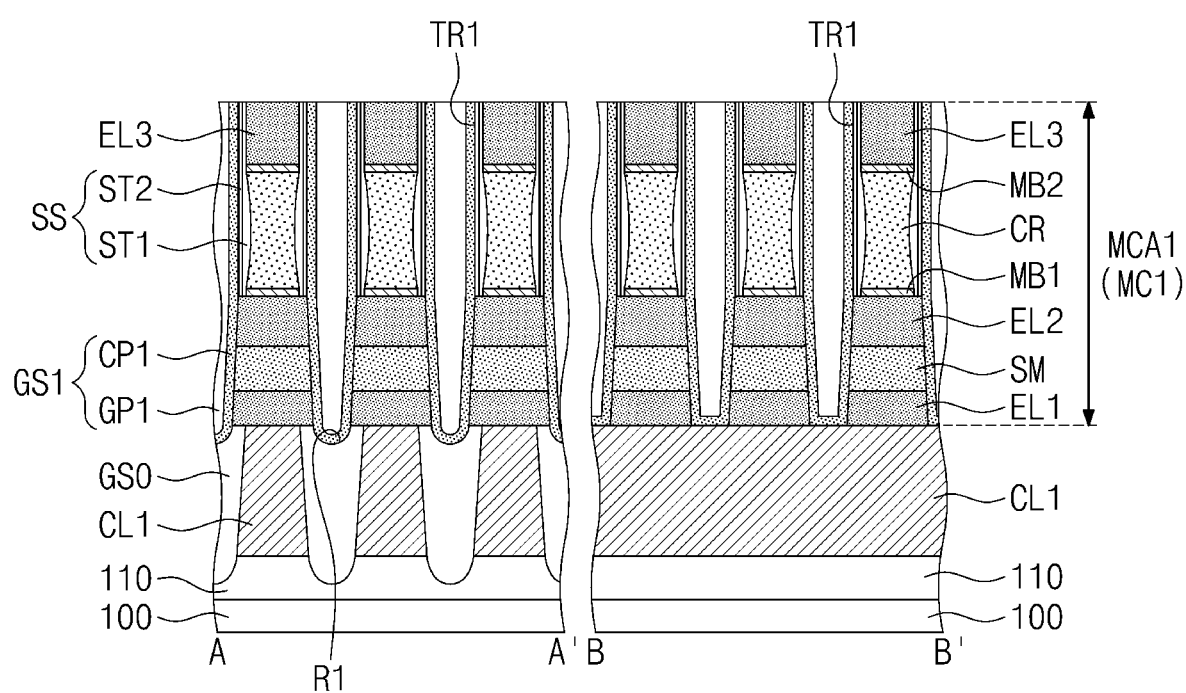

Referring to FIGS. 3 and 16, a first liner pattern CP1 and a first filling pattern GP1 may be formed to sequentially cover an inside of the first trench TR1. The first liner pattern CP1 and the first filling pattern GP1 may constitute a first buried structure GS1. The first liner pattern CP1 may extend into the first recessed regions R1. Thereafter, a planarization process may be performed to expose top surfaces of the third electrodes EL3. The first liner pattern CP1 may be formed by chemical vapor deposition, physical vapor deposition, and/or atomic layer deposition. After the first liner pattern CP1 is deposited, a post-treatment process may be performed to improve film quality. For example, the post-treatment process may include at least one selected from annealing, UV treatment, and plasma treatment. An inert gas, such as N, He, and Ar, may be used in the post-treatment.

The first filling pattern GP1 may be formed by using a thin-layer formation method with excellent gap-fill properties, such as flowable chemical vapor deposition (FCVD) or spin-on-glass (SOG) coating. For example, the first filling pattern GP1 may be formed by flowable chemical vapor deposition that uses SiOC. The first trench TR1 may be filled with a dielectric layer without seam or void. For another example, the first filling pattern GP1 may be formed by atomic layer deposition, chemical vapor deposition, and/or physical vapor deposition.

Figure 17:
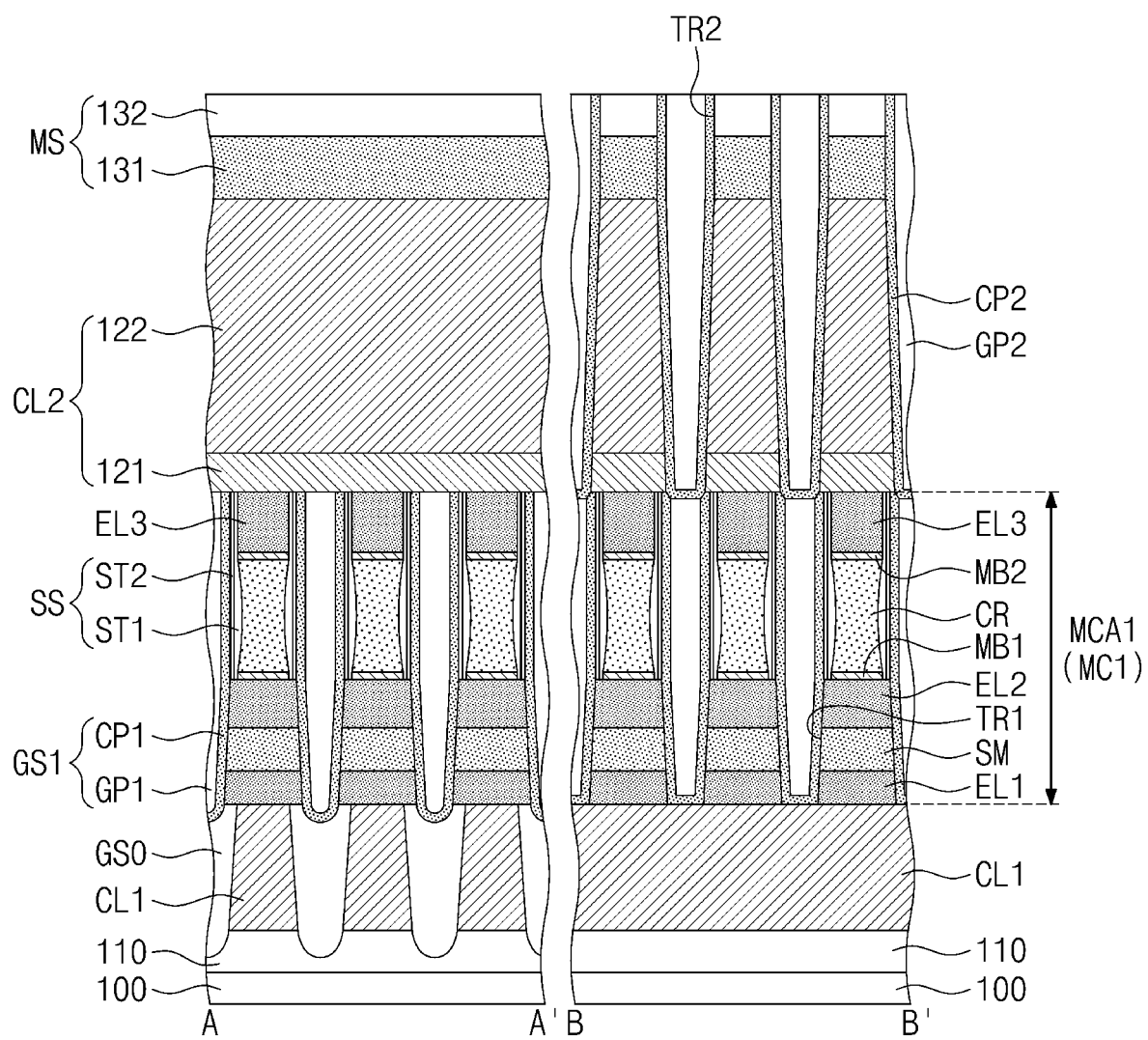

Referring to FIGS. 3 and 17, second conductive lines CL2 may be formed on the first memory cell stack MCA1. The formation of the second conductive lines CL2 may include sequentially forming a barrier layer and a metal layer, and then forming second trenches TR2 using mask patterns MS as an etching mask. Each of the second conductive lines CL2 may be formed to include a barrier pattern 121 and a metal pattern 122. The mask patterns MS may include second mask patterns 131 and third mask patterns 132. For example, the second mask patterns 131 may include silicon nitride, and the third mask patterns 132 may include silicon oxide.

A plurality of dielectric layers may be formed to sequentially cover insides of the second trenches TR2, and a planarization process may be performed to form a second liner pattern CP2 and a second filling pattern GP2. The second liner pattern CP2 and the second filling pattern GP2 may be formed using the same material and the same method as those for the formation of the first liner pattern CP1 and the first filling pattern GP1. This may hold true for other liner patterns and other filling patterns. For example, the second filling pattern GP2 may be formed by flowable chemical vapor deposition that uses SiOC. The planarization process may expose the third mask patterns 132, and may separate each of the second liner pattern CP2 and the second filling pattern GP2 into pieces in each of the second trenches TR2.

Figure 18:
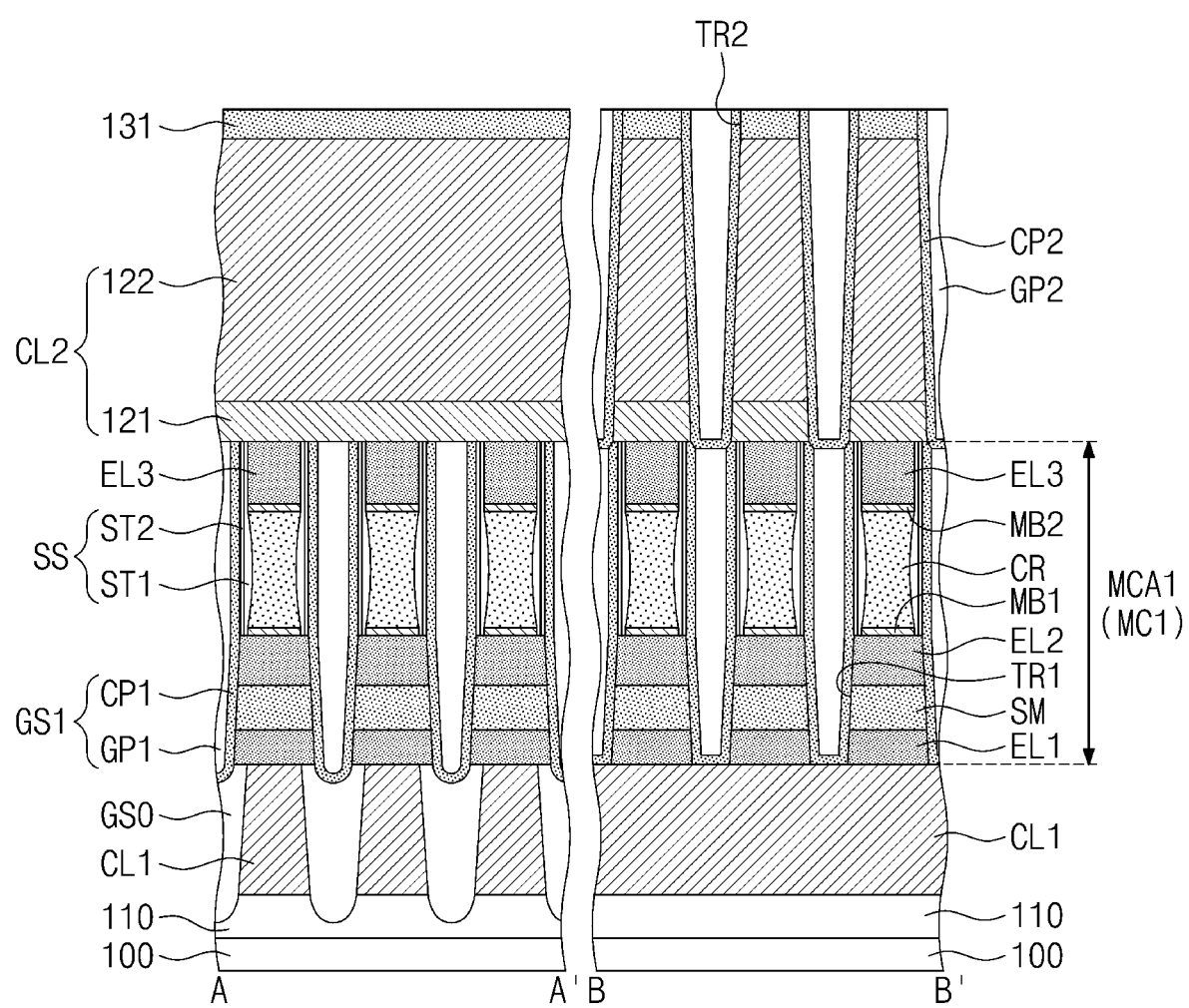

Referring to FIGS. 3 and 18, a planarization process may be performed to remove the third mask patterns 132 and to expose top surfaces of the second mask patterns 131.

Figure 19:
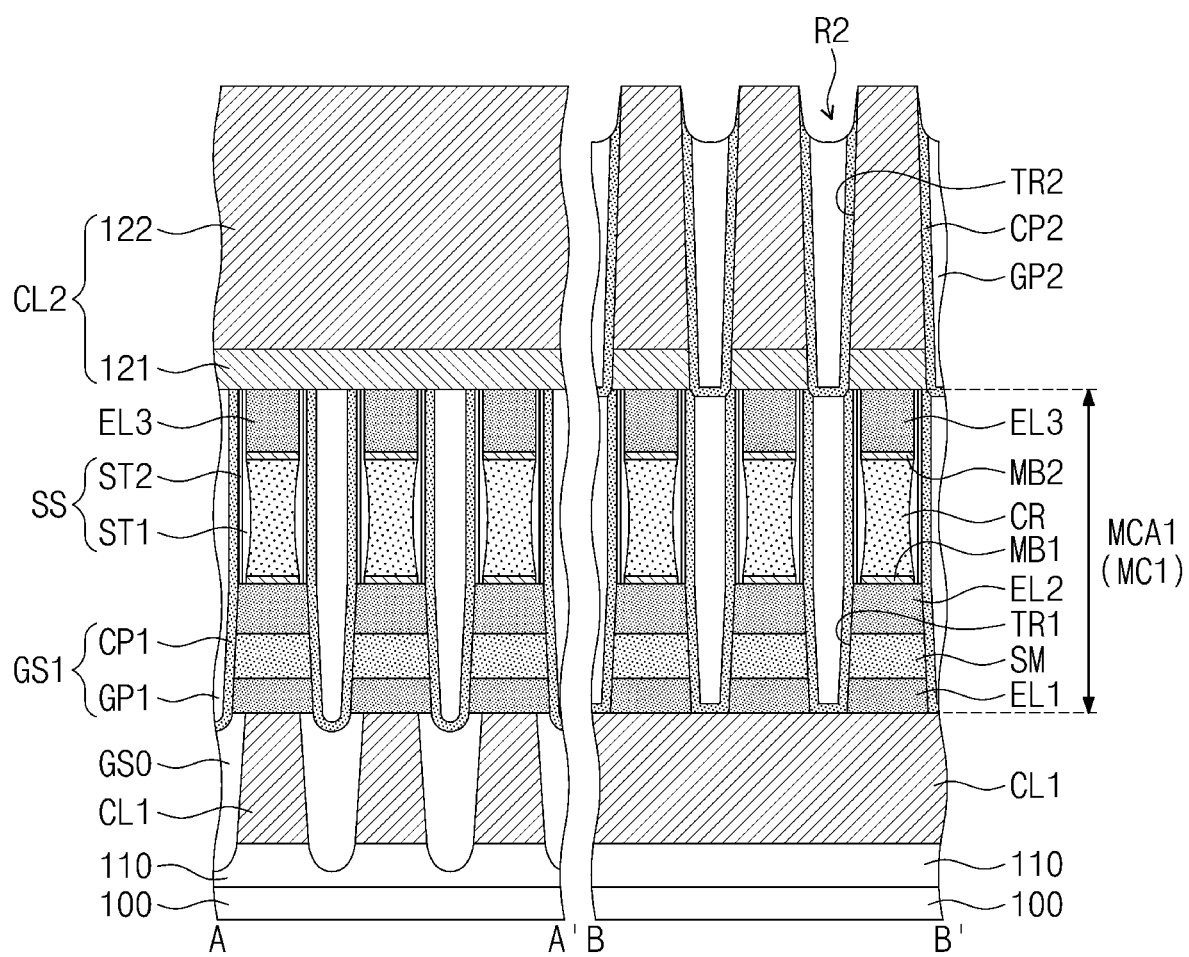

Referring to FIGS. 3 and 19, a planarization process may be performed to remove the second mask patterns 131. The planarization processes of FIGS. 17 to 19 may be differentiated from each other, or alternatively at least two of the planarization processes of FIGS. 17 to 19 are not differentiated from each other. As a result of the planarization process discussed in FIG. 19, an upper portion of each of the second liner pattern CP2 and the second filling pattern GP2 may be removed to form second recessed regions R2. The second recessed regions R2 may be formed due to dishing caused by a difference in physical characteristics between the second conductive lines CL2, the second liner pattern CP2, and the second filling pattern GP2. The planarization process may include an in-situ cleaning process that uses HF.

Figure 20:
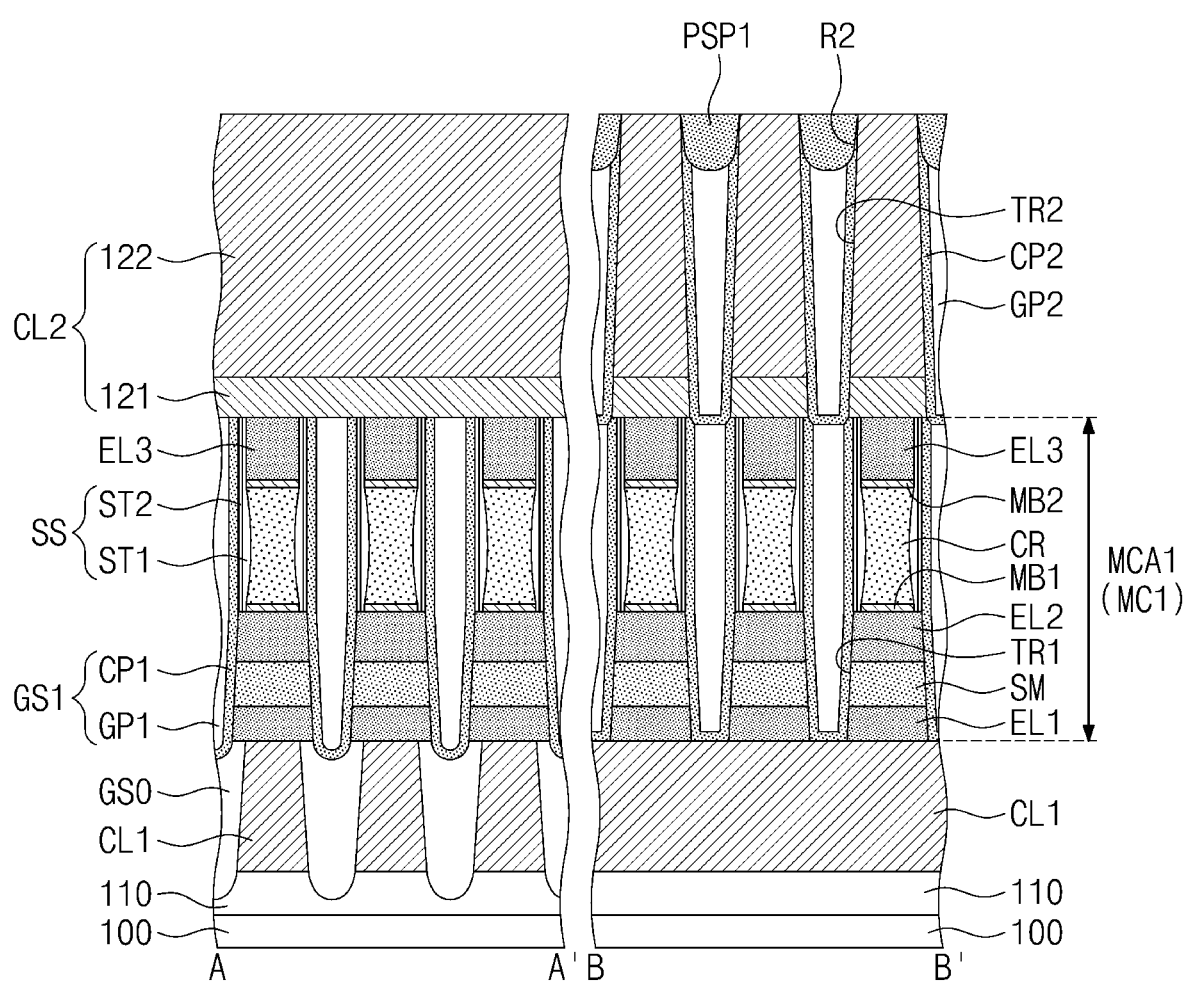

Referring to FIGS. 3 and 20, preliminary first capping patterns PSP1 may be formed to fill the second recessed regions R2. For example, the preliminary first capping patterns PSP1 may be formed by atomic layer deposition. The preliminary first capping patterns PSP1 may each be formed to have a single layer including one of $SiO_2$, SiN, and SiON or a multi-layered structure (i.e., a multi-layered pattern) in which a plurality of single layers are stacked on each other. Each layer of the multi-layered pattern may include one of $SiO_2$, SiN, and SiON.

A planarization process may be performed on the preliminary first capping patterns PSP1 to expose the second conductive lines CL2. The preliminary first capping patterns PSP1 are illustrated to have their top surfaces at a height (or level) which is the same as or lower than that of top surfaces of the second conductive lines CL2.

Figure 21:
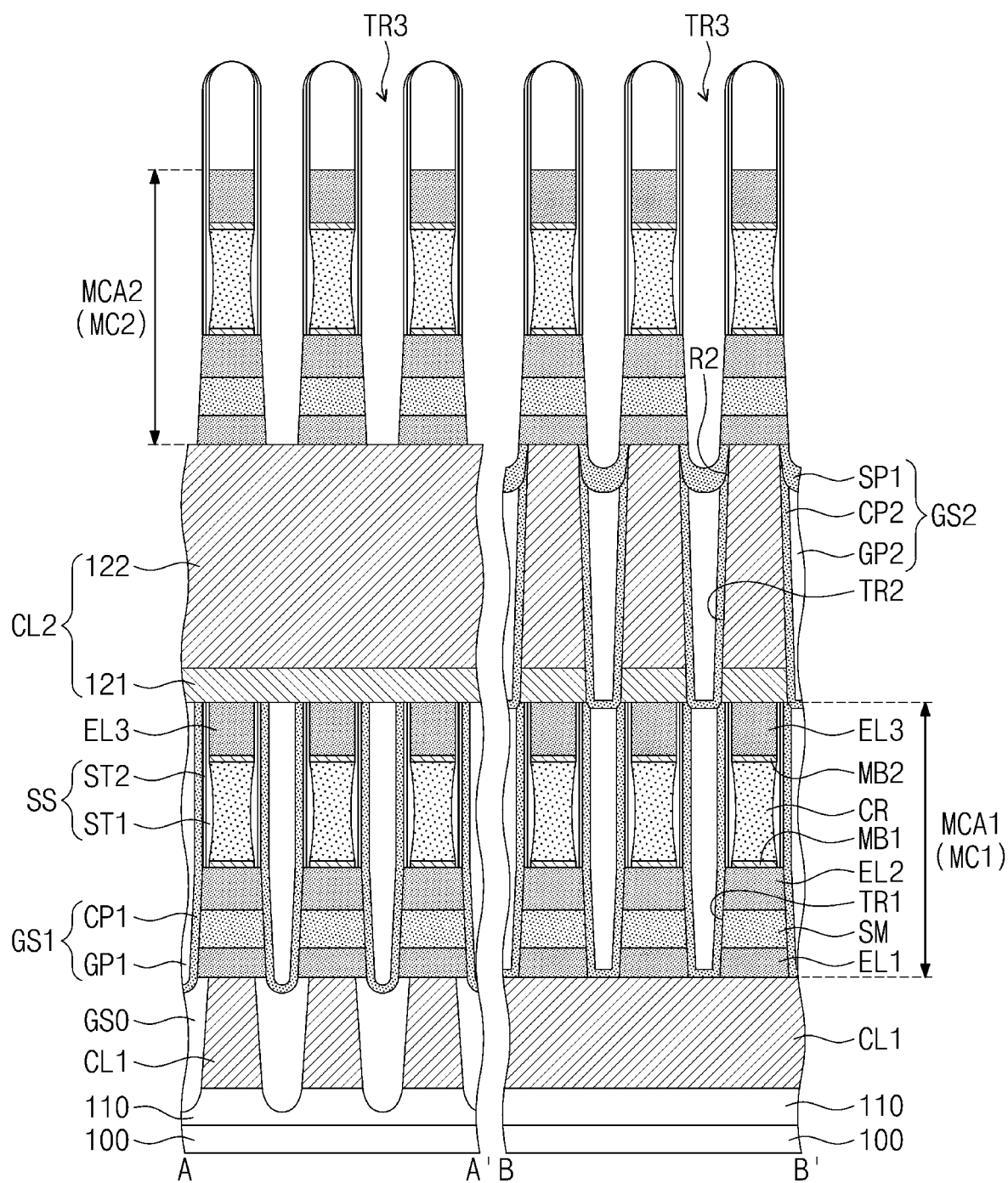

Referring to FIGS. 3 and 21, a second memory cell stack MCA2 including second cell structures MC2 may be formed on the second conductive lines CL2. The second cell structures MC2 may be formed by substantially the same method as that used for the formation of the first cell structures MC1 discussed with reference to FIGS. 13 to 15. A third trench TR3 may be formed between the second cell structures MC2. During the formation of the third trench TR3, upper portions of the preliminary first capping patterns PSP1 may be etched to form first capping patterns SP1. Each of the second buried structures GS2 may be formed to include the second liner pattern CP2, the second filling pattern GP2, and the first capping pattern SP1.

When using an etchant for the etching process to form the second cell structures MC2, the second filling patterns GP2 may be etched at a higher rate than that at which the second liner pattern CP2 is etched. When the first capping patterns SP1 are absent, the second filling patterns GP2 may experience an excessive removal or an etch distribution to induce instability of a capping structure for the second cell structures MC2, which may result in leaning of the second cell structures MC2 and cell bridging due to the leaning. According to the some example embodiments of the present inventive concepts, the first capping patterns SP1 may be formed whose etching resistance to their related process is greater than that of the second filling pattern GP2, with the result that it may be possible to solve the leaning of the second cell structures MC2.

Figure 22:
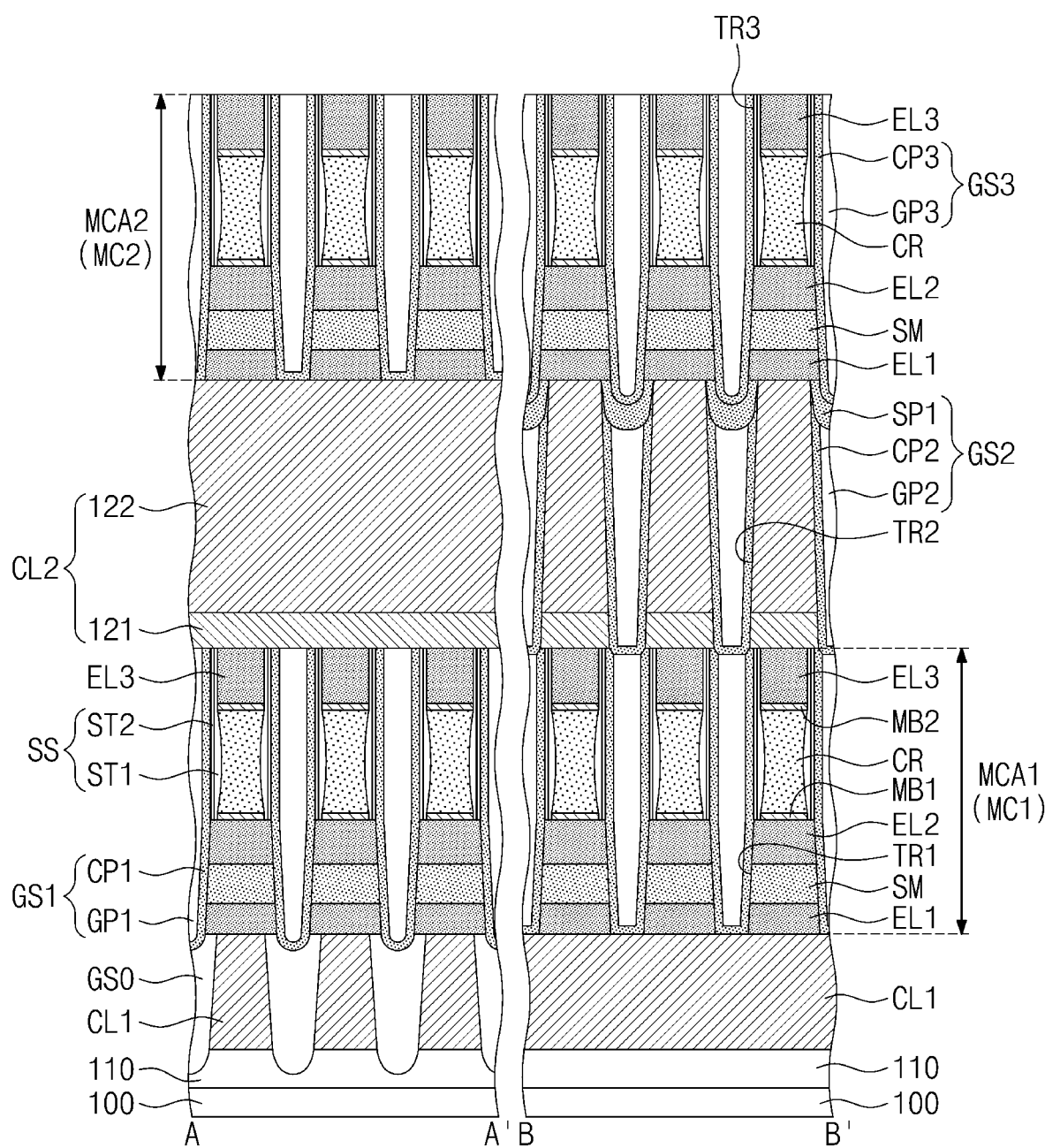

Referring to FIGS. 3 and 22, a third liner pattern CP3 and a third filling pattern GP3 may be formed to sequentially cover an inside of the third trench TR3. The third liner pattern CP3 and the third filling pattern GP3 may constitute a third buried structure GS3. The third liner pattern CP3 may extend between the second conductive lines CL2, and may cover a top surface of the first capping pattern SP1. The third buried structure GS3 may be formed by substantially the same method as that used for the formation of the first buried structure GS1 discussed with reference to FIG. 16. The third filling pattern GP3 may be formed by flowable chemical vapor deposition that uses SiOC.

Referring back to FIGS. 3 and 4, third conductive lines CL3 may be formed on the second memory cell stack MCA2. The formation of the third conductive lines CL3 may include sequentially forming a barrier layer and a metal layer, and forming trenches using mask patterns as an etching mask. Each of the third conductive lines CL3 may be formed to include a barrier pattern 123 and a metal pattern 124. After that, a plurality of dielectric layers may be formed, and a planarization process may be performed to form fourth buried structures GS4. Each of the fourth buried structures GS4 includes a fourth liner pattern CP4 and a fourth filling pattern GP4. The fourth filling pattern GP4 may be formed by flowable chemical vapor deposition that uses SiOC. After the planarization process, an upper mask pattern 134 may remain, or alternatively the upper mask pattern 134 does not remain.

Figure 23:
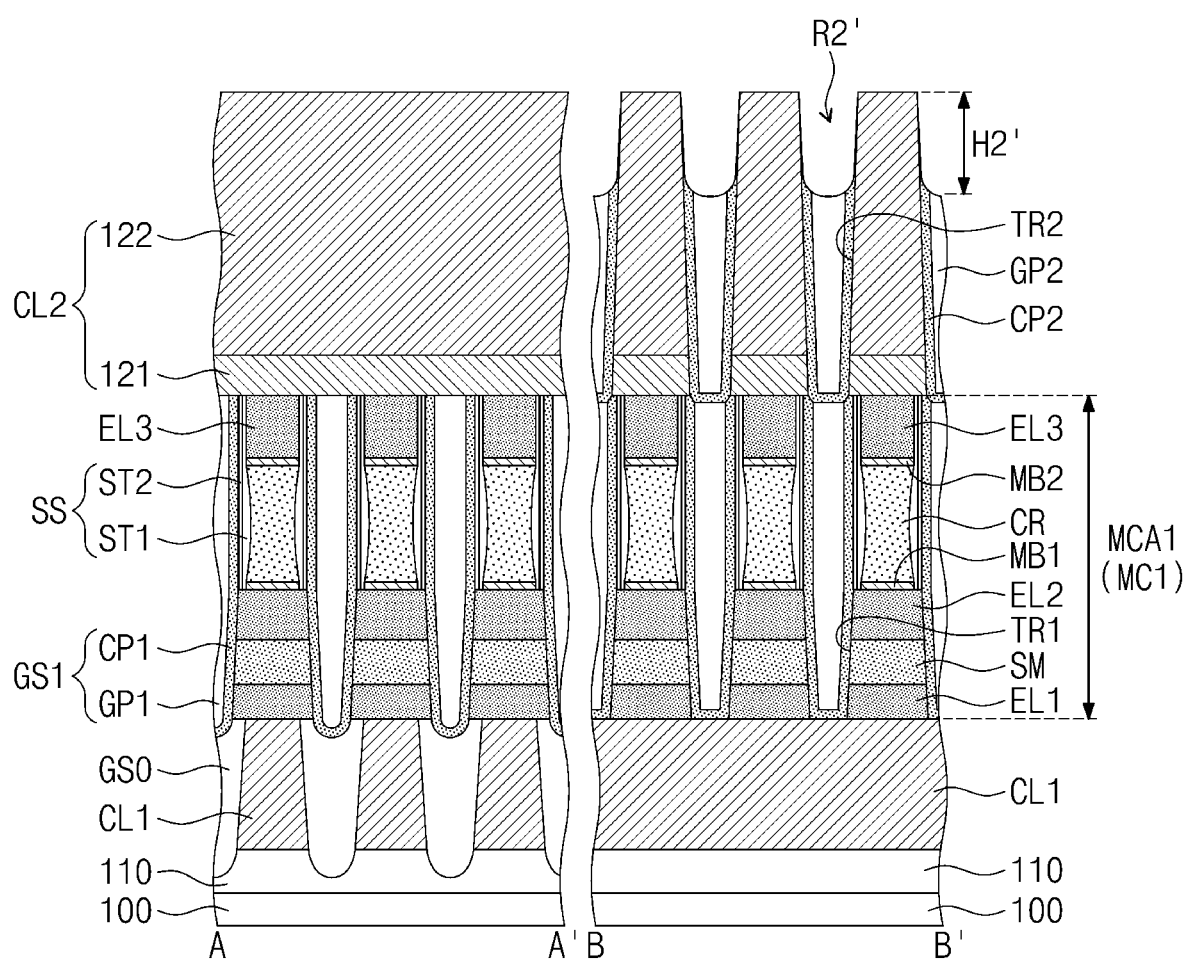
FIG. 23 illustrates a cross-sectional view taken along lines A-A' and B-B' of FIG. 3, showing a method of fabricating a variable resistance memory device according to some example embodiments of the present inventive concepts.

FIG. 23 illustrates a cross-sectional view taken along lines A-A' and B-B' of FIG. 3, showing a method of fabricating a variable resistance memory device according to some example embodiments of the present inventive concepts.

The resultant structure discussed with reference to FIG. 19 may undergo an additional etching process that is performed on the second liner pattern CP2 and the second filling pattern GP2. The additional etching process may include a dry etch and/or a wet etch. The second recessed regions R2 may expand toward the substrate 100, and thus expanded second recessed regions R2' may be formed.

Afterwards, the processes of FIGS. 20 to 22 may be performed. As a result, the structure discussed with reference to FIGS. 7 to 9 may be formed.

Figure 24:
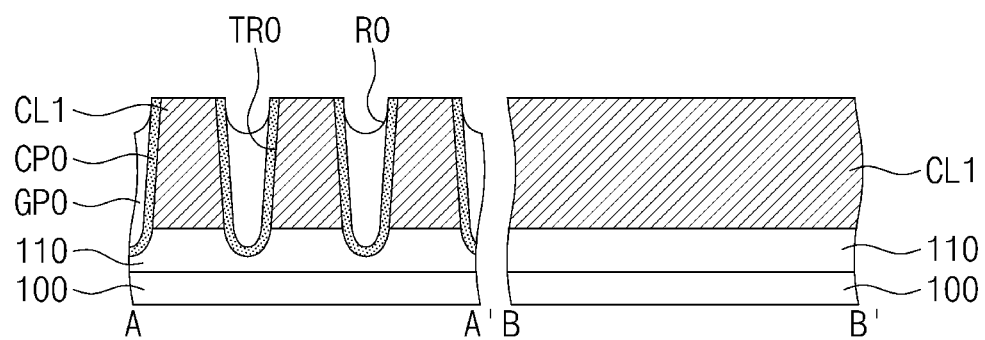
FIGS. 24 to 26 illustrate cross-sectional views taken along lines A-A' and B-B' of FIG. 3, showing a method of fabricating a variable resistance memory device according to some example embodiments of the present inventive concepts.
Figure 25:
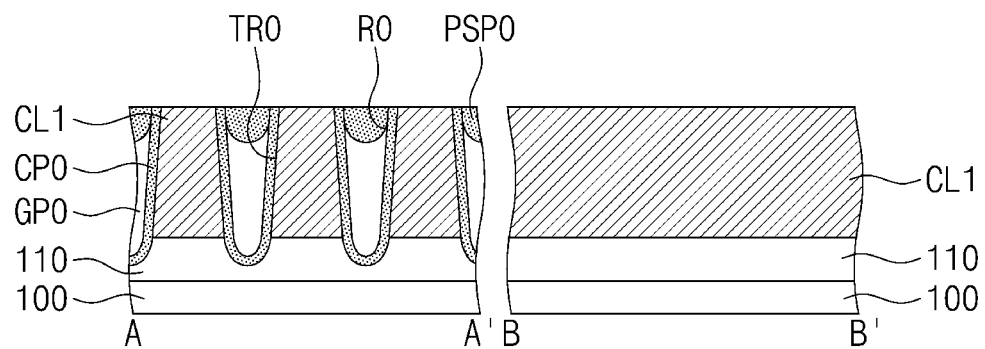
Figure 26:
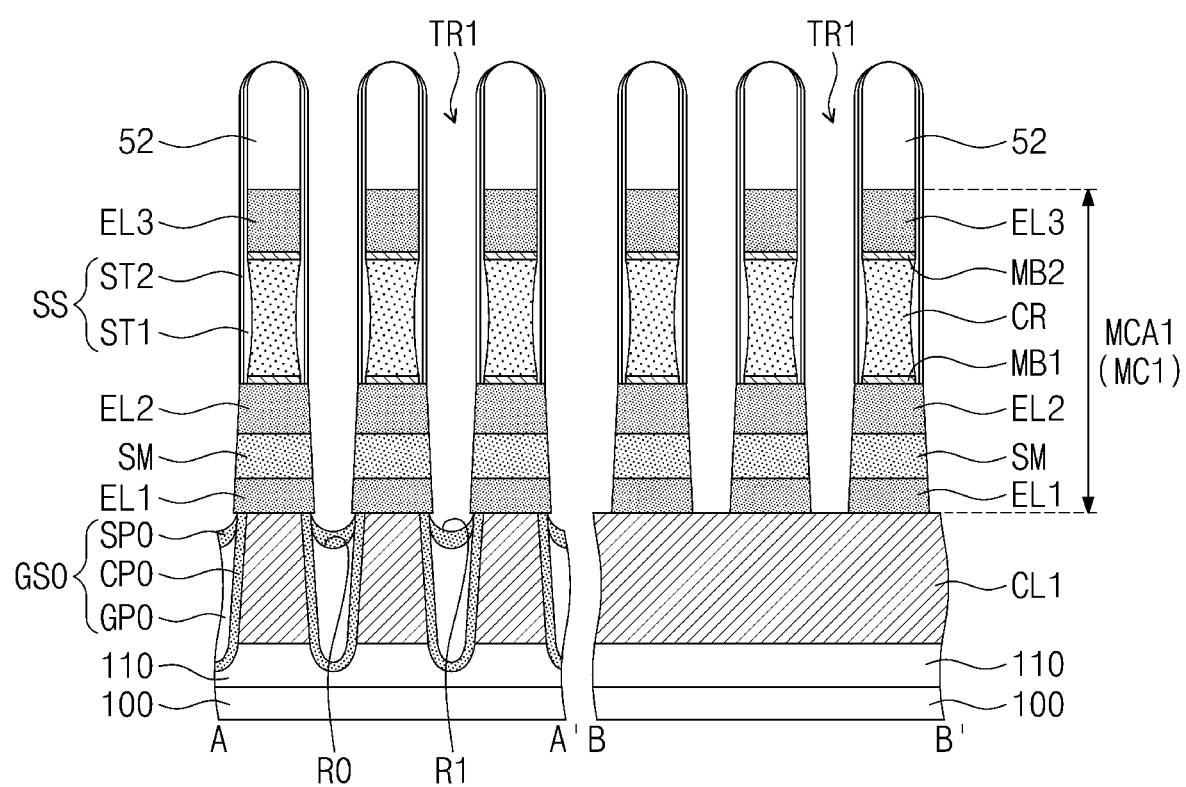

FIGS. 24 to 26 illustrate cross-sectional views taken along lines A-A' and B-B' of FIG. 3, showing a method of fabricating a variable resistance memory device according to some example embodiments of the present inventive concepts.

Referring to FIGS. 3 and 24, an interlayer dielectric layer 110 and first conductive lines CL1 may be formed on a substrate 100. Lower trenches TR0 may separate the first conductive lines CL1 from each other. A lower liner pattern CP0 and a lower filling pattern GP0 may be formed in each of the lower trenches TR0. A planarization process may be performed to form the lower liner pattern CP0 and the lower filling pattern GP0. The lower filling pattern GP0 may be formed by flowable chemical vapor deposition that uses SiOC. As a result of the planarization process, lower recessed regions R0 may be formed on an upper portion of the lower filling pattern GP0.

Referring to FIGS. 3 and 25, preliminary lower capping patterns PSP0 may be formed to fill the lower recessed regions R0. For example, the preliminary lower capping patterns PSP0 may be formed by atomic layer deposition. The preliminary lower capping patterns PSP0 may be formed either of a single layer including one of $SiO_2$, SiN, and SiON or of a multi-layered structure (i.e., a multi-layered pattern) that includes a plurality of single layers stacked on each other. Each layer of the multi-layered pattern may include one of $SiO_2$, SiN, and SiON.

Referring to FIGS. 3 and 26, the processes discussed with reference to FIGS. 13 to 15 may be performed to form a first memory cell stack MCA1. A first trench TR1 between the first cell structures MC1 may further extend toward the substrate 100. For example, upper portions of the preliminary lower capping patterns PSP0 may be etched to form first recessed regions R1 and lower capping patterns SP0. Each of the lower buried structures GS0 may be formed to include the lower liner pattern CP0, the lower filling pattern GP0, and the lower capping pattern SP0. Afterwards, the processes discussed with reference to FIGS. 16 to 22 may be performed to form the variable resistance memory device discussed with reference to FIG. 10.

According to some example embodiments of the present inventive concepts, it may be possible to prevent leaning or bridging that may occur during a time when cell structures are being patterned. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Although some example embodiments of the present inventive concepts have been discussed with reference to accompanying figures, it will be understood that various changes in form and details may be made therein without departing from the spirit and scope of the present inventive concepts. It therefore will be understood that the embodiments described above are just illustrative but not limitative in all aspects.

What is claimed is:

1. A variable resistance memory device, comprising:
a plurality of first conductive lines that extend in a first direction;
a plurality of second conductive lines that extend in a second direction crossing the first direction and are arranged on the plurality of first conductive lines;
a plurality of first cell structures at intersections between the plurality of first conductive lines and the plurality of second conductive lines, each of the first cell structures including a switching pattern and a variable resistance pattern;
a plurality of first buried structures that fill a plurality of first trenches between the plurality of first conductive lines and extend in the first direction; and
a plurality of second buried structures that fill a plurality of second trenches between the plurality of first cell structures,
wherein each of the plurality of first buried structures includes:
a first liner pattern that covers sidewalls of a corresponding first trench of the plurality of first trenches;
a first filling pattern that is disposed on the first liner pattern and in the corresponding first trench; and
a first capping pattern configured to seal the corresponding first trench in which the first liner pattern and the first filling pattern are provided, and
wherein the plurality of second buried structures extend in the plurality of second trenches and are connected with a plurality of first capping patterns of the plurality of first buried structures.

2. The device of claim 1,
wherein the first capping pattern includes a material whose etching resistance is greater than etching resistance of the first filling pattern, and
wherein the etching resistance of the first capping pattern and the etching resistance of the first filling pattern are determined with respect to an etching process of forming the plurality of second trenches.

3. The device of claim 2,
wherein the first filling pattern includes silicon oxycarbide, and
wherein the first capping pattern is formed of a single layer having one of silicon oxide, silicon nitride and silicon oxynitride (SiON).

4. The device of claim 2,
wherein the first filling pattern includes silicon oxycarbide, and
wherein the first capping pattern is formed a multi-layered pattern including a first layer of silicon oxide and a second layer of silicon nitride.

5. The device of claim 1,
wherein the lowermost bottom surface of the first capping pattern is positioned at a level which is equal to or greater than about ⅔ times a height of a first conductive line of the plurality of first conductive lines, and
wherein the first conductive line is adjacent to the corresponding first trench.

6. The device of claim 1,
wherein a distance from a top surface of a first conductive line of the plurality of first conductive lines to the lowermost bottom surface of the first capping pattern ranges from about 50 Å to about 350 Å.

7. The device of claim 1,
wherein each of the plurality of second buried structures includes a second liner pattern and a second filling pattern, and
wherein, when viewed in plan, a plurality of second filling patterns of the plurality of second buried structures are arranged in a lattice shape.

8. The device of claim 1,
wherein a bottom surface of the first capping pattern has a convex shape toward the first filling pattern.

9. The device of claim 1,
wherein a bottom surface of the first capping pattern is in contact with a top surface of the first filling pattern and a top surface of the first liner pattern.

10. The device of claim 1,
wherein a carbon concentration of the first filling pattern is higher than a carbon concentration of the first capping pattern.

11. The device of claim 1,
wherein each of the plurality of first conductive lines has a first portion having an upper width and a second portion having a lower width which is greater than the upper width, and
wherein the first portion of each of the plurality of first conductive lines is closer to the plurality of second conductive lines than the second portion of each of the plurality of first conductive lines.

12. The device of claim 1, further comprising:
a substrate; and
a peripheral circuit region between the substrate and the plurality of first conductive lines.

13. The device of claim 1, further comprising:
a plurality of third conductive lines that extend in the first direction and are arranged on the plurality of second conductive lines;
a plurality of second cell structures at intersections between the plurality of second conductive lines and the plurality of third conductive lines;
a third buried structure that fills a plurality of third trenches between the plurality of second cell structures; and
a plurality of fourth buried structures that fill a plurality of fourth trenches between the plurality of third conductive lines and extend in the first direction,
wherein each of the fourth buried structures includes:
a fourth liner pattern that covers sidewalls of a corresponding fourth trench of the plurality of fourth trenches;
a fourth filling pattern that is disposed on the fourth liner pattern and in the corresponding fourth trench; and
a fourth capping pattern configured to seal the corresponding fourth trench in which the fourth filling pattern and the fourth liner pattern are provided.

14. A variable resistance memory device, comprising:
a plurality of first conductive lines that extend in a first direction;
a plurality of second conductive lines that extend in a second direction crossing the first direction and are arranged on the plurality of first conductive lines;
a plurality of first cell structures at intersections between the plurality of first conductive lines and the plurality of second conductive lines, each of the plurality of first cell structures including a switching pattern and a variable resistance pattern; and
a plurality of first buried structures that fill a plurality of first trenches between the plurality of first conductive lines and extend in the first direction,
wherein each of the plurality of first buried structures includes:

a first liner pattern that covers sidewalls of a corresponding first trench of the plurality of first trenches;

a first filling pattern on the first liner pattern and in the corresponding first trench; and a capping pattern disposed in the corresponding first trench, wherein the capping pattern covers a top surface of the first liner pattern and a top surface of the first filling pattern, wherein a bottom surface of the capping pattern has a convex shape toward the capping pattern, wherein the lowermost bottom surface of the capping pattern is positioned at a level that is equal to or greater than about ⅔ times a height of a first conductive line of the plurality of first conductive lines, and wherein the first conductive line is adjacent to the corresponding first trench.

15. The device of claim 14, wherein the lowermost upper surface of the capping pattern is lower than a top surface of the first conductive line.

16. The device of claim 14, wherein the plurality of first buried structures include two first buried structures adjacent to each other and a second conductive line, between the two first buried structures, among the plurality of first conductive lines, and wherein the second conductive line is disposed between a capping pattern of one of the two first buried structures and a capping pattern of the other.

17. The device of claim 14, wherein the first filling pattern includes silicon oxycarbide, and wherein the capping pattern is formed of a single layer having one of silicon oxide and silicon nitride.

18. The device of claim 14, wherein the first filling pattern includes silicon oxycarbide, and wherein the capping pattern is formed of a multi-layered pattern including a first layer of silicon oxide and a second layer of silicon nitride.

19. A variable resistance memory device, comprising:

a substrate;

a plurality of first conductive lines on the substrate, the plurality of first conductive lines extending in a first direction;

a plurality of second conductive lines that extend in a second direction crossing the first direction and are arranged on the plurality of first conductive lines;

a plurality of first cell structures at intersections between the plurality of first conductive lines and the plurality of second conductive lines;

a plurality of first buried structures that fill a plurality of first trenches between the plurality of first conductive lines and extend in the first direction; and a plurality of second buried structures that fill a plurality of second trenches between the plurality of first cell structures, wherein each of the plurality of first buried structures includes:

a first liner pattern that covers sidewalls of a corresponding first trench among the plurality of first trenches;

a first filling pattern on the first liner pattern and in the corresponding first trench; and a first capping pattern on the first filling pattern and in the corresponding first trench, wherein each of the plurality of second buried structures includes a second liner pattern and a second filling pattern, wherein each of the first plurality of cell structures includes a first electrode, a switching pattern, a second electrode, a variable resistance pattern, and a third electrode that are sequentially provided, and wherein the plurality of second buried structures extend in the plurality of second trenches and are connected with a plurality of first capping patterns of the plurality of first buried structures.

20. The device of claim 19, wherein a distance from a top surface of a first conductive line, among the plurality of first conductive lines, to the lowermost bottom surface of the first capping pattern ranges from about 50 Å to about 350 Å.

* * * * *